US010079187B2

(12) United States Patent
Beckmeier et al.

(10) Patent No.: US 10,079,187 B2
(45) Date of Patent: Sep. 18, 2018

(54) SEMICONDUCTOR DEVICES AND METHODS FOR TESTING A GATE INSULATION OF A TRANSISTOR STRUCTURE

(71) Applicant: Infineon Technologies AG, Neubiberg (DE)

(72) Inventors: Daniel Beckmeier, Unterhaching (DE); Andreas Martin, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/497,002

(22) Filed: Apr. 25, 2017

(65) Prior Publication Data

US 2017/0316991 A1  Nov. 2, 2017

(30) Foreign Application Priority Data

Apr. 28, 2016 (DE) .................. 10 2016 107 953

(51) Int. Cl.
*H01L 29/10* (2006.01)
*H01L 21/66* (2006.01)
(Continued)

(52) U.S. Cl.
CPC .......... *H01L 22/34* (2013.01); *G01R 31/2818* (2013.01); *H01L 22/14* (2013.01);
(Continued)

(58) Field of Classification Search
CPC ......... H01L 22/34; H01L 22/14; H01L 29/78; G01R 31/2625
See application file for complete search history.

(56) References Cited

U.S. PATENT DOCUMENTS 5,650,651 A * 7/1997 Bui ................... H01L 21/32136
257/355
6,016,062 A  1/2000 Nicollian et al.
(Continued)

FOREIGN PATENT DOCUMENTS

DE   10135805 A1   2/2003

OTHER PUBLICATIONS

Lee, Y. H., et al. "Correlation of Plasma Process Induced Charging With Fowler-Nordheim Stress in P-and N-Channel Transistors." IEDM Tech. Dig.. Dec. 1992, 4 pages.

*Primary Examiner* — A. Sefer
(74) *Attorney, Agent, or Firm* — Slater Matsil, LLP

(57) ABSTRACT

A semiconductor device includes a first test structure including a first portion of a conductive structure and a second portion of the conductive structure located within a first lateral wiring layer of a layer stack of the semiconductor device. The first portion of the conductive structure of the first test structure is electrically connected to the second portion of the conductive structure of the first test structure through a third portion located within a second lateral wiring layer of the layer stack arranged above the first lateral wiring layer. Further, the first portion of the conductive structure of the first test structure is electrically connected to a gate of a test transistor structure, a doping region of the test transistor structure or an electrode of a test capacitor. Additionally, the first portion of the conductive structure of the first test structure is electrically connected to a first test pad of the first test structure.

19 Claims, 13 Drawing Sheets

(51) Int. Cl.
    *G01R 31/28*     (2006.01)
    *G01R 31/26*     (2014.01)
    *H01L 29/78*     (2006.01)

(52) U.S. Cl.
    CPC ...... *G01R 31/2621* (2013.01); *G01R 31/2625* (2013.01); *H01L 29/78* (2013.01)

(56) References Cited

U.S. PATENT DOCUMENTS

| | | | |
|---|---|---|---|
| 6,075,292 A * | 6/2000 | Noguchi | H01L 23/60 257/750 |
| 6,414,358 B1 | 7/2002 | Lin et al. | |
| 6,873,170 B2 | 3/2005 | Asam et al. | |
| 9,490,245 B1 * | 11/2016 | Sahu | H01L 27/092 |
| 2001/0010093 A1 * | 7/2001 | Nagayoshi | G06F 17/5077 257/206 |
| 2006/0115911 A1 * | 6/2006 | Itou | H01L 22/14 438/18 |
| 2007/0069759 A1 | 3/2007 | Rzepiela et al. | |
| 2007/0131931 A1 * | 6/2007 | Higuchi | H01L 22/34 257/48 |
| 2016/0211187 A1 * | 7/2016 | Zhang | G06F 17/5081 |

\* cited by examiner

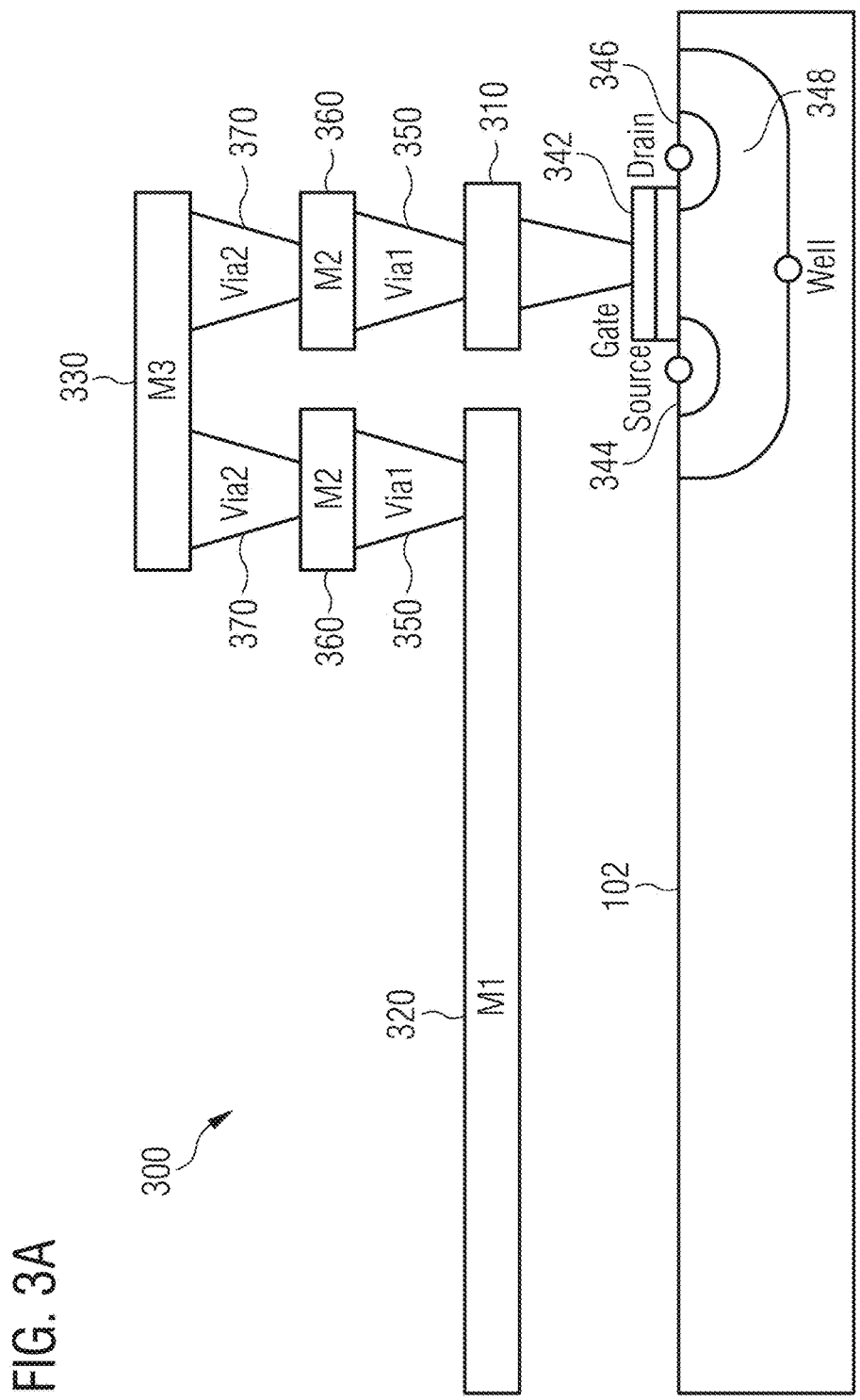

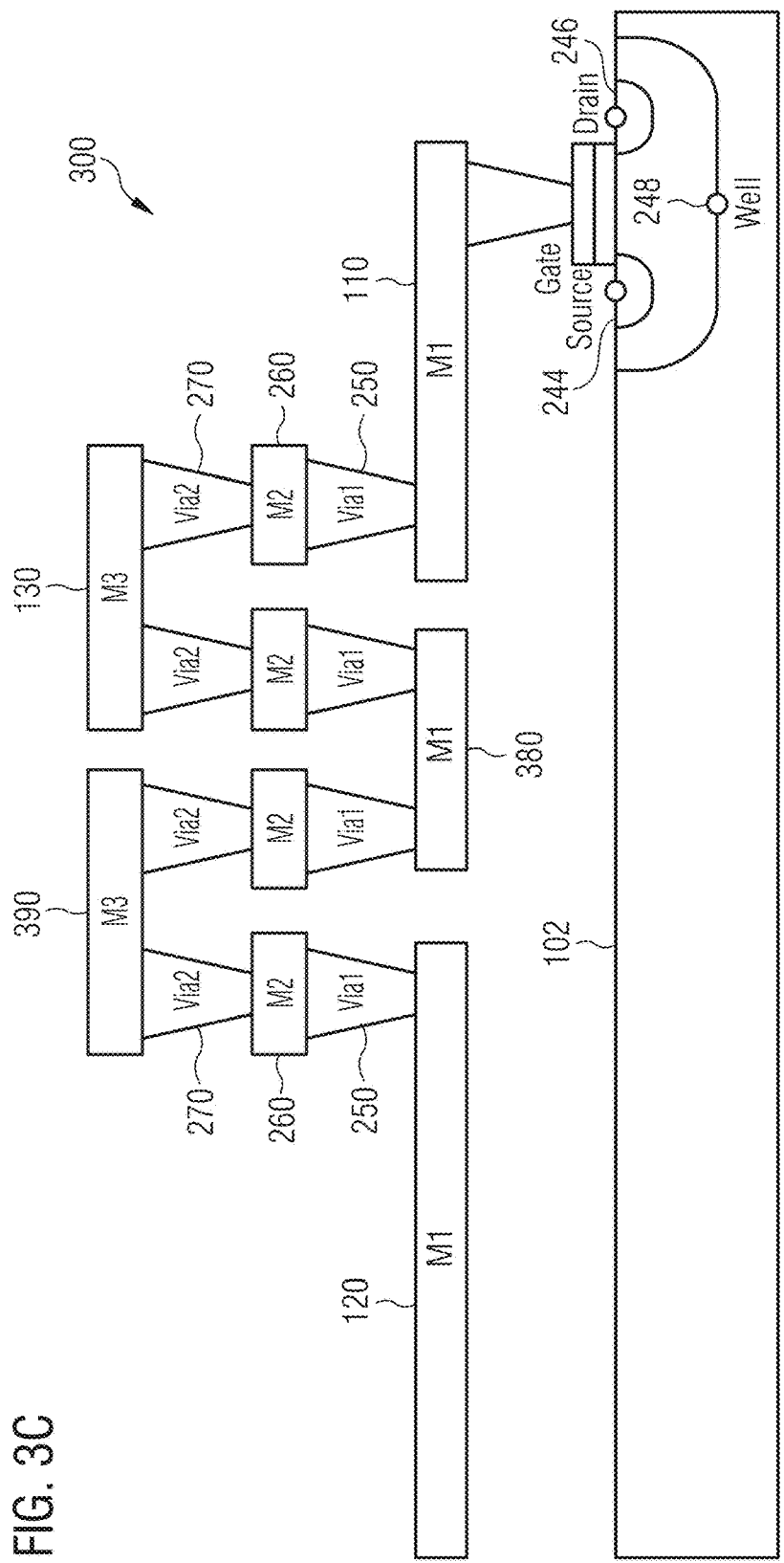

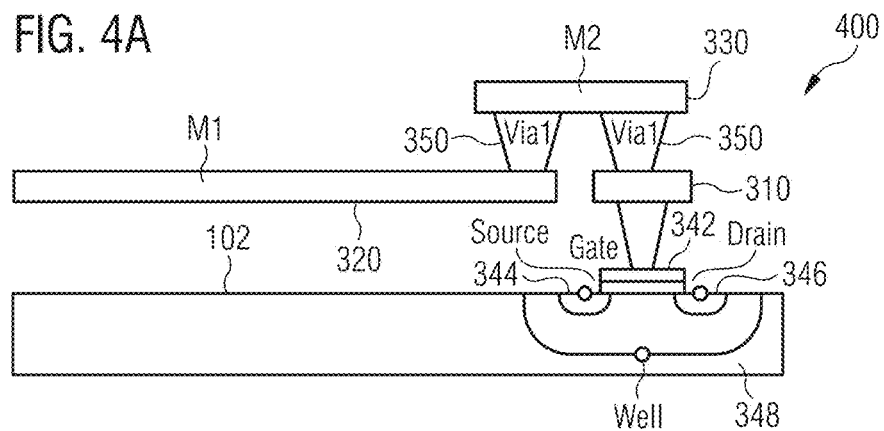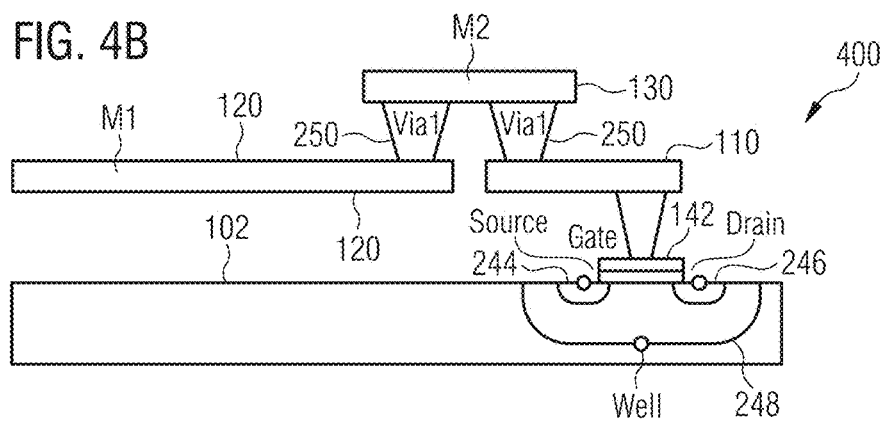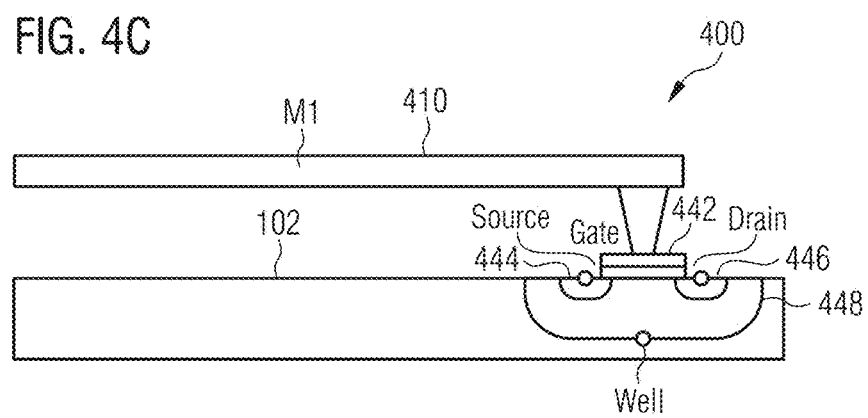

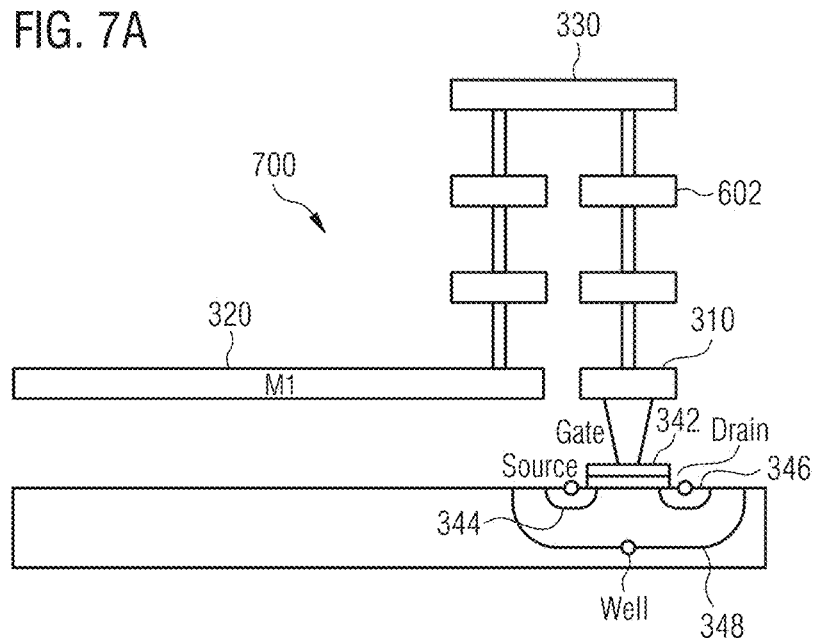
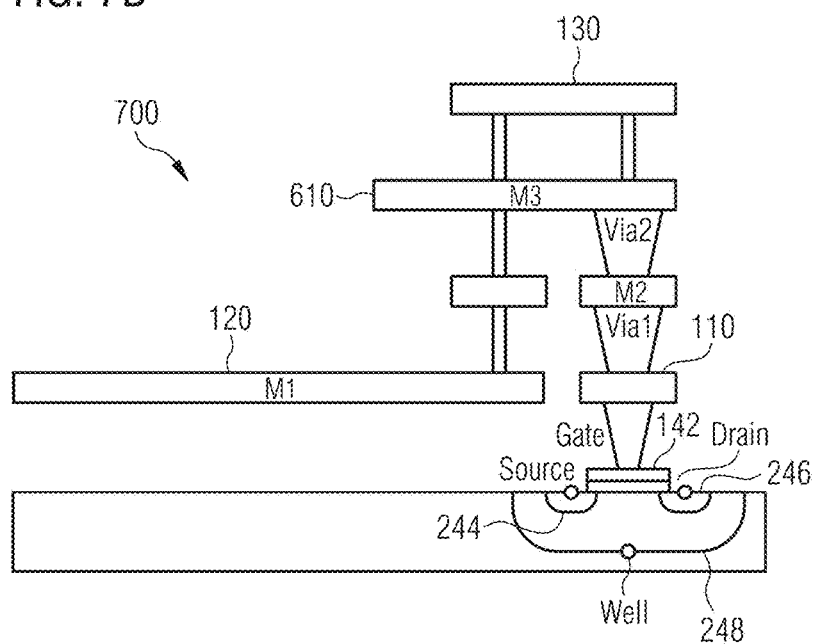

SEMICONDUCTOR DEVICES AND METHODS FOR TESTING A GATE INSULATION OF A TRANSISTOR STRUCTURE

CROSS-REFERENCE TO RELATED APPLICATIONS

This application claims the priority of German patent application 10 2016 10 7953.7, filed Apr. 28, 2016, which application is hereby incorporated herein by reference in its entirety.

TECHNICAL FIELD

Embodiments relate to test concepts for gate insulations of transistors and in particular to semiconductor devices and methods for testing a gate insulation of a transistor structure.

BACKGROUND

Many wafer production processes are based on plasma effects. Charged particles are used. Examples are etching processes of contacts and vias, processes structuring aluminum metal lines, and Plasma-enhanced chemical vapor deposition PECVD processes depositing inter-metal dielectrics. During the wafer processing such plasma processes can charge metal lines. If such a line is connected to the gate of a transistor in the product, the charge can cause a tunneling current through the gate oxide damaging or destroying the oxide. The damage can be in form of neutral oxide defects forming trap states in the oxides, which can be recharged by product operation during the product lifetime. With too many trap states being charged, the transistor parameters can shift so far that the product may fail during its lifetime.

SUMMARY

It may be a demand to provide concepts for test structures, which allow to improve the accuracy and/or reliability of gate insulation tests.

Such a demand may be satisfied by the subject matter of the claims.

Some embodiments relate to a semiconductor device comprising a first test structure. The first test structure comprises a first portion of a conductive structure and a second portion of the conductive structure located within a first lateral wiring layer of a layer stack of the semiconductor device. The first portion of the conductive structure of the first test structure is electrically connected to the second portion of the conductive structure of the first test structure through a third portion located within a second lateral wiring layer of the layer stack arranged above the first lateral wiring layer. Further, the first portion of the conductive structure of the first test structure is electrically connected to a gate of a test transistor structure, a doping region of the test transistor structure or an electrode of a test capacitor. Additionally, the first portion of the conductive structure of the first test structure is electrically connected to a first test pad of the first test structure. A sum of a lateral area occupied by the first portion of the conductive structure of the first test structure and a lateral area occupied by the second portion of the conductive structure of the first test structure is at least larger than 10 times a lateral area occupied by the gate of the test transistor structure or the electrode of the test capacitor.

Some embodiments relate to a method for testing a gate insulation of a transistor structure. The method comprises applying a predefined current or a predefined voltage between a first test pad and a second test pad of a first test structure of a semiconductor device. The first test pad is connected to a gate of a test transistor structure or a doping region of the test transistor structure through a conductive structure located within a layer stack of the semiconductor device. The conductive structure of the first test structure comprises a first portion of the conductive structure and a second portion of the conductive structure located within a first lateral wiring layer of the layer stack. Further, the first portion of the conductive structure of the first test structure is electrically connected to the second portion of the conductive structure of the first test structure through a third portion located within a second lateral wiring layer of the layer stack arranged above the first lateral wiring layer. Additionally, the method comprises measuring a first voltage between the first test pad and the second test pad of the first test structure during applying the predefined current or a first current between the first test pad and the second test pad of the first test structure during applying the predefined voltage.

BRIEF DESCRIPTION OF THE DRAWINGS

Some embodiments of apparatuses and/or methods will be described in the following by way of example only, and with reference to the accompanying figures, in which:

FIG. 3a shows a schematic cross section of a reference test structure of a semiconductor device;

FIG. 3b shows a schematic cross section of a first test structure of the semiconductor device shown in FIG. 3a;

FIG. 3c shows a schematic cross section of an alternative first test structure of the semiconductor device shown in FIG. 3a;

FIG. 4a shows a schematic cross section of a reference test structure of another semiconductor device;

FIG. 4b shows a schematic cross section of a first test structure of the semiconductor device shown in FIG. 4a;

FIG. 4c shows a schematic cross section of a second test structure of the semiconductor device shown in FIG. 4a;

FIG. 6b shows a schematic cross section of a first test structure of the semiconductor device shown in FIG. 6a;

FIG. 7a shows a schematic cross section of a reference test structure of a semiconductor device with a shielding structure within a lower most lateral metal wiring layer;

FIG. 7b shows a schematic cross section of a first test structure of the semiconductor device shown in FIG. 7a;

DETAILED DESCRIPTION OF ILLUSTRATIVE EMBODIMENTS

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
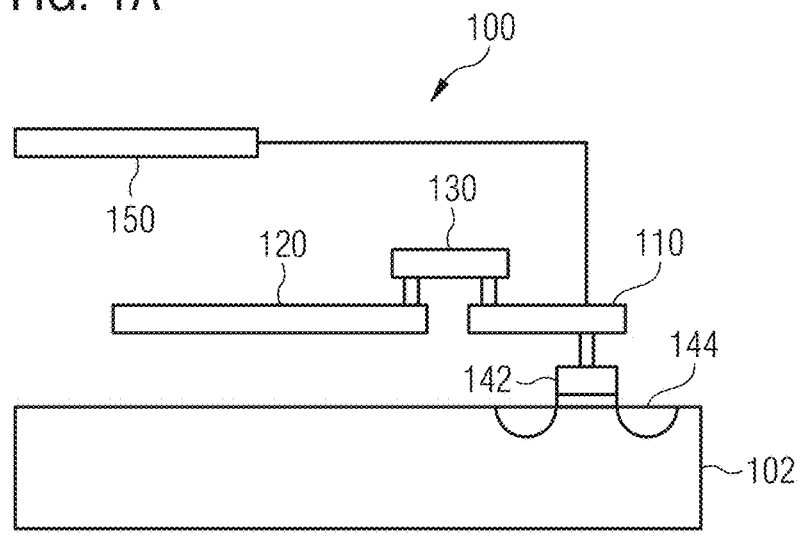
FIGS. 1a and 1b show a schematic cross section and a schematic top view of a semiconductor device.
Figure 1B:
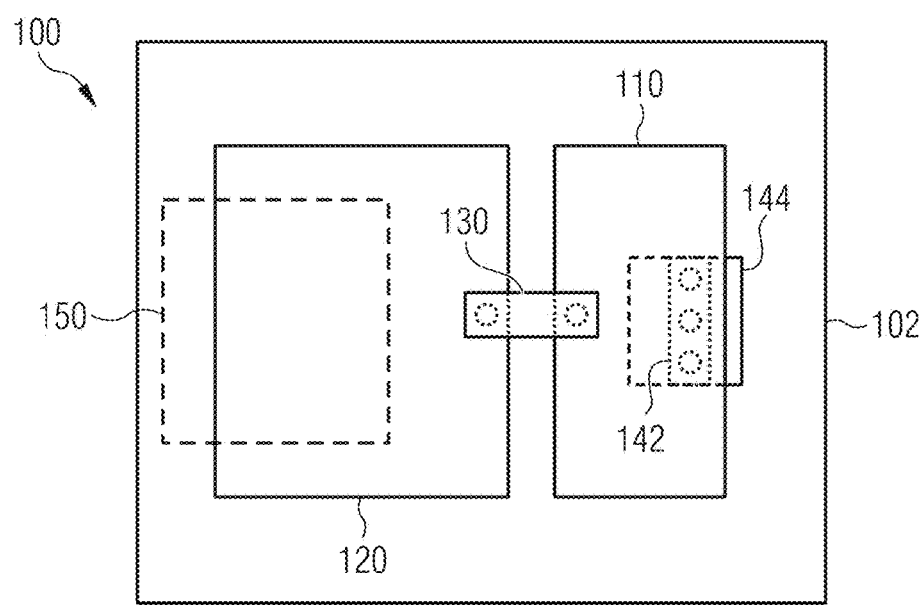

FIGS. 1a and 1b show a schematic cross section and a schematic top view of a semiconductor device according to an embodiment. The semiconductor device 100 comprises a first test structure. The first test structure comprises a first (conductive) portion 110 of a conductive structure and a second (conductive) portion 120 of the conductive structure located in a first lateral wiring layer of a layer stack of the semiconductor device 100. The first portion 110 of the conductive structure of the first test structure is electrically connected to the second portion 120 of the conductive structure of the first test structure via a third (conductive) portion 130 of the conductive structure located in a second lateral wiring layer of the layer stack arranged above the first lateral wiring layer. Further, the first portion 110 of the conductive structure of the first test structure is electrically connected to a gate 142 of a test transistor structure or a doping region 144 of the test transistor structure. Alternatively, the first portion 110 of the conductive structure of the first test structure may be electrically connected to an electrode of a capacitor. Additionally, the first portion 110 of the conductive structure of the first test structure is electrically connected to a first test pad 150 of the first test structure. A sum of a lateral area occupied by the first portion 110 of the conductive structure of the first test structure and a lateral area occupied by the second portion 120 of the conductive structure of the first test structure is at least larger than 10 times a lateral area occupied by the gate 142 of the test transistor structure (or alternatively at least larger than 10 times a lateral area occupied by the electrode of the capacitor) or at least larger than a lateral area occupied by a well embedding doping regions of the test transistor structure.

By connecting a portion of a conductive structure to a gate or doping region of a test transistor structure through a wiring layer located above this portion, a plasma induced charging of the gate or a well embedding the doping region of the test transistor during manufacturing of the conductive structure can be avoided. Further, this portion together with a portion of the conductive structure connected directly to the gate or doping region may cause a leakage current towards the semiconductor substrate and a capacitive charge current during test measurements, which may be in the same range as a leakage current and charge current of other test and/or reference structures with different area ratios. In this way, a more accurate and/or more reliable determination of differences between different test and/or reference structures may be enabled.

The first test structure comprises the test transistor structure formed at a semiconductor substrate 102 (e.g. doping regions of the transistor structure are formed in the semiconductor substrate, while the gate is formed outside the semiconductor substrate) and the conductive structure located within the layer stack (e.g. wiring layer stack) of the semiconductor device 100.

The conductive structure of the first test structure is an electrically conductive structure located within the layer stack of the semiconductor device 100. The layer stack may be formed at a front side of a semiconductor substrate 102 of the semiconductor device 100. The conductive structure of the first test structure comprises several portions located within different lateral wiring layers and vertical wiring layers of the layer stack. At least the first portion 110 and the second portion 120 of the conductive structure of the first test structure are located in the first lateral wiring layer and at least the third portion 130 of the conductive structure of the first test structure is located in the second lateral wiring layer. The second lateral wiring layer of the layer stack is arranged above the first lateral wiring layer, which means that the first lateral wiring layer is located closer to the front side surface of the semiconductor substrate 102 than the second lateral wiring layer, for example. The conductive structure of the first test structure may comprise further electrically conductive portions within one or more lateral wiring layers and/or one or more vertical wiring layers. For example, the conductive structure of the first test structure may comprise at least vertical wiring portions connecting the first and second portion to the third portion of the conductive structure of the first test structure located within one or more vertical wiring layers located vertically between the first lateral wiring layer and the second lateral wiring layer. One or more further lateral wiring layers and/or vertical wiring layers may be located vertically between the first lateral wiring layer and the second lateral wiring layer.

The first portion 110 of the conductive structure of the first test structure is located within the first lateral wiring layer and is electrically connected (ohmic connection) to the second portion 120, the first test pad 150 and the gate or the doping region (e.g. source doping region, drain doping region or well doping region) of the test transistor structure (or alternatively to an electrode of a capacitor). For example, the first portion 110 of the conductive structure of the first test structure is electrically insulated from the second portion 120 of the conductive structure of the first test structure within the first lateral wiring layer. For example, the electrical connection of the first portion 110 to the second portion 120 may be formed by electrical conductive parts of the conductive structure located above the first lateral wiring layer only so that the first portion 110 and the second portion 120 of the conductive structure of the first test structure are electrically insulated from each other at the time of forming the first portion 110 and the second portion 120 during manufacturing the first lateral wiring layer. In this way, a plasma induced charging of the gate or the doping region of the test transistor structure (or the electrode of the capacitor) due to forming the second portion 120 may be avoided. The electrical connection of the first portion 110 to the gate 142 or the doping region 144 of the test transistor structure may be formed by a vertical wiring portion located within a vertical wiring layer (e.g. pre-metal dielectric layer) located vertically between the first lateral wiring layer and the gate 142 or the doping region 144 of the test transistor structure.

Further, the electrical connection of the first portion 110 to the first test pad 150 of the first test structure may be implemented as additional electrical conductive path between the first portion 110 and the first test pad 150 as schematically illustrated in FIG. 1a or through the third portion 130 (and optionally additionally the second portion) of the conductive structure of the first test structure, for example. For example, the third portion 130 of the conductive structure of the first test structure may be located vertically below the first test pad 150 or the third portion 130 may be part of the first test pad 150 or may form the first test pad 150.

The first test pad 150 of the first test structure may be a pad of the semiconductor device 100 enabling an electrical connection to an external electrical device (e.g. test system). For example, the first test pad 150 of the first test structure may be externally accessible by measurement needles or tips or may be connected to a pin or ball of a package of the semiconductor device 100.

The second portion 120 of the conductive structure of the first test structure is located within the first lateral wiring layer and is electrically connected (ohmic connection) to the first portion (as well as the gate or the doping region of the test transistor structure) through the third portion 130 of the conductive structure of the first test structure. For example, the electrically conductive connection through the third portion 130 is the only ohmic connection between the second portion 120 of the conductive structure of the first test structure to the gate 142 or the doping region 144 of the test transistor structure. For example, the second portion 120 of the conductive structure of the first test structure is electrically insulated (e.g. completely electrically insulated from other electrical conductive portions) except for a connection to the third portion 130 of the conductive structure of the first test structure. Optionally, more than two portions of the conductive structure of the first test structure may be located in the first lateral wiring layer and may be connected to the first portion 110 through portions located in a lateral wiring layer above the first lateral wiring layer (e.g. FIG. 3c) or the second portion may comprise two or more sub-portions connected via one or more portions located in a lateral wiring layer above the first lateral wiring layer.

The third portion 130 of the conductive structure of the first test structure is located within the second lateral wiring layer and is electrically connected (ohmic connection) to the first portion 110 and the second portion 120 through different vertical wiring portions of the conductive structure of the first test structure, for example. The third portion 130 of the conductive structure of the first test structure may be significantly smaller than the first portion 110 and/or the second portion 120 to keep the plasma induced charge during forming the third portion 130 low (e.g. FIG. 1b). For example, a lateral area occupied by the third portion 130 of the conductive structure of the first test structure may be less than 50% (or less than 10% or less than 1%) of a lateral area occupied by the second portion 120 (and/or a lateral area occupied by the first portion).

The first portion 110, the second portion 120 and/or the third portion 130 of the conductive structure of the first test structure may comprise laterally a rectangular shape, a square shape, a meander shape, a comb shape or another lateral geometry.

The lateral area occupied by the first portion 110 of the conductive structure of the first test structure may be the two-dimensional area covered by the first portion 110 in a top view of the semiconductor device 100. Similarly, a lateral area occupied by the second portion 120 of the conductive structure of the first test structure may be the two-dimensional area covered by the second portion 120 in a top view of the semiconductor device 100.

The sum of the lateral areas covered by the first portion 110 and the second portion 120 is larger than 10 times (or larger than 100 times, larger than 1000 or larger than 10000 times) a lateral area occupied by the gate of the test transistor structure and/or larger than (one time, 10 times, 100 times or 1000 times) a lateral area occupied by a well embedding doping regions of the test transistor structure. For example, the lateral area occupied by the second portion 120 may be significantly larger than the lateral area occupied by the first portion 110 of the conductive structure of the first test structure so that a plasma induced charging of the gate or the doping region of the test transistor structure due to the large second portion 120 may be avoided. Alternatively, the first portion 110 may be larger than the second portion 120, if the test structure is used (as an antenna effect test portion) for detecting plasma induced damages due to conductive structures within the first lateral wiring layer, for example.

The first test structure may comprise an antenna effect test portion being part of the conductive structure of the first test structure. The antenna effect test portion may be a portion represented by the first portion of the conductive structure of the first test structure. For example, the first portion 110 of the conductive structure of the first test structure is formed on a vertical electrical conductive wiring structure electrically connected to the gate 142 or the doping region 144 of the test transistor structure so that plasma induced charging of the gate 142 or the doping region 144 of the test transistor structure may occur during forming the first portion 110. Therefore, a potential occurring at the gate 142 or doping region 144 due to plasma induced charge carriers may depend on a size of the lateral area of the first portion 110. For example, the first portion 110 works as an antenna for collecting charge carriers during manufacturing of the conductive portions of the first lateral wiring layer. Alternatively, the antenna effect test portion of the first test structure may be located in a (lateral or vertical) wiring layer located above the first lateral wiring layer. For example, a lateral area occupied by the antenna effect test portion of the conductive structure of the first test structure may be larger than 0.005 $\mu m^2$, larger than 0.05 $\mu m^2$, larger than 0.5 $\mu m^2$, larger than 1 $\mu m^2$, larger than 10 $\mu m^2$, larger than 100 $\mu m^2$ or larger than 1000 $\mu m^2$.

For example, the sum of the lateral areas covered by the first portion 110 and the second portion 120 of the conductive structure of the first test structure may be larger than 20% (or larger than 50% or larger than 80%) of a lateral area covered by the antenna effect test portion of the conductive structure of the first test structure.

The semiconductor device 100 may comprise additionally a reference test structure. The reference test structure may comprise a first portion of a conductive structure and a second portion of the conductive structure located in the first lateral wiring layer. Further, the first portion of the conductive structure of the reference test structure may be electrically connected to the second portion of the conductive structure of the reference test structure through a third portion located within the second lateral wiring layer or a third lateral wiring layer of the layer stack arranged above the first lateral wiring layer. Additionally, the first portion of the conductive structure of the reference test structure may be electrically connected to a gate of a reference transistor structure, a doping region of the reference transistor structure or an electrode of a capacitor. Further, the first portion of the conductive structure of the reference test structure may be electrically connected to a first test pad of the reference test structure. A sum of a lateral area occupied by the first portion of the conductive structure of the reference test structure and a lateral area occupied by the second portion of the conductive structure of the reference test structure may be at least larger than 10 times (or larger than 100 times, larger than 1000 or larger than 10000 times) a lateral area occupied by the gate of the test transistor structure or a lateral area occupied by the electrode of the capacitor.

The first portion, the second portion, the third portion and the reference transistor structure of the reference test structure may be implemented similar to the first portion, the second portion, the third portion and the test transistor structure of the first test structure. For example, the first portion of the conductive structure of the reference test structure may be electrically insulated from the second portion of the conductive structure of the reference test structure within the first lateral wiring layer.

For example, a sum of all lateral areas occupied by electrically conductive portions located within the first lateral wiring layer and electrically connected to the gate of the test transistor structure of the first test structure may differ by less than 50% (or less than 20%, less than 10% or less than 5% or less than 1%) from a sum of all lateral areas occupied by electrically conductive portions located within the first lateral wiring layer and electrically connected to the gate of the reference transistor structure of the reference test structure. In this way, a leakage current between the semiconductor substrate 102 and the first test structure originated in the first lateral wiring layer may be nearly equal to a leakage current between the semiconductor substrate 102 and the reference test structure originated in the first lateral wiring layer during test measurements (e.g. gate insulation damage test measurement). For example, the sum of the lateral area (in the first lateral wiring layer) occupied by the first portion 110 of the conductive structure of the first test structure and the lateral area (in the first lateral wiring layer) occupied by the second portion 120 of the conductive structure of the first test structure differs by less than 20% (or less than 10% or less than 5% or less than 1%) from the sum of the lateral area occupied by the first portion of the conductive structure of the reference test structure and the lateral area occupied by the second portion of the conductive structure of the reference test structure.

The reference test structure may comprise an antenna effect test portion being part of the conductive structure of the reference test structure. The antenna effect test portion may occupy a small lateral area to keep the plasma induced charges during manufacturing very low for the reference test structure. Nevertheless, at least a very small portion of the conductive structure of the reference test structure may be located in the (lateral or vertical) wiring layer intended to be tested for causing plasma induced damages, which may be the antenna effect test portion of the reference test structure. For example, a lateral area occupied by the antenna effect test portion of the conductive structure of the reference test structure may be smaller than 100 $\mu m^2$, smaller than 10 $\mu m^2$ or larger than 1 $\mu m^2$.

For example, an antenna effect test portion of the conductive structure of the reference test structure may be a portion represented by the first portion of the conductive structure of reference test structure. For example, the first portion of the conductive structure of the reference test structure is formed on top of a vertical electrical conductive wiring structure electrically connected to the gate or the doping region of the reference transistor structure. Due to the small area occupied by the antenna effect test portion of the conductive structure of the reference test structure, plasma induced charging of the gate or the doping region of the test transistor structure may be kept low. Alternatively, the antenna effect test portion of the conductive structure of the reference test structure may be located in a (lateral or vertical) wiring layer located above the first lateral wiring layer.

For example, a lateral area occupied by an antenna effect test portion (e.g. the first portion) of the conductive structure of the first test structure may be at least 10% (or more than 20%, more than 50%, more than 100% or more than 200%) larger than a lateral area occupied by an antenna effect test portion (e.g. the first portion) of the conductive structure of the reference test structure. Further, the antenna effect test portion of the conductive structure of the first test structure and the antenna effect test portion of the conductive structure of the reference test structure may be located within the same (lateral or vertical) wiring layer.

For example, the antenna effect test portion of the conductive structure of the first test structure is represented by the first portion 110 of the conductive structure of the first test structure and the antenna effect test portion of the conductive structure of the reference test structure is represented by the first portion of the conductive structure of the first test structure. In this way, a plasma induced damage of the gate insulation of the test transistor structure may be detected by test measurements, while a leakage current between the conductive structures of the first test structure and the reference test structure and the semiconductor substrate 102 may be substantially equal during the measurement.

For example, the antenna effect test portion of the conductive structure of the first test structure and the antenna effect test portion of the conductive structure of the reference test structure may be located within a (lateral or vertical) wiring layer above the first lateral wiring layer. In this way, the first and second portions of the first test structure and the reference test structure may be used as shielding structures to avoid or reduce leakage currents between the antenna effect test portions and the semiconductor substrate 102 during test measurements. For example, a lateral area occupied by the first portion 110 of the conductive structure of the first test structure may differ by less than 20% (or less than 10%, less than 5% or less than 1%) from a lateral area occupied by the first portion of the conductive structure of the reference test structure, if the antenna effect test portions of the first test structure and the reference test structure are located within a wiring layer above the first lateral wiring layer. In this way, the plasma induced charge during forming the first portions of the first test structure and the reference test structure may be substantially equal. Therefore, a difference in a gate insulation damage between the transistor structures of the first test structure and the reference test structure may be caused substantially only by a different size of the antenna effect test portions, for example.

The semiconductor device 100 may comprise a plurality of test structures including the first test structure. The test structures of the plurality of test structures may be implemented similarly to the first test structure, but with antenna effect test portions of different lateral size and/or located in different lateral or vertical wiring layers. In this way, a plurality of measurement results of different test structures can be compared, for example.

For example, the plurality of test structures may comprise between 3 and 20 (or between 5 and 10) test structures with antenna effect test portion of different lateral size. For example, each test structure of (at least a subset of) the plurality of test structures may comprise an antenna effect test portion of a conductive structure of the respective test structure. The antenna effect test portions of the conductive structures of the test structures of the plurality of test structures may occupy different lateral areas each. In this way, a critical area size of a conductive portion within a specific wiring layer for plasma induced damaging of gate insulations of transistor structures may be determined.

For example, each test structure of the plurality of test structures may comprise a conductive structure located within the layer stack of the semiconductor device and connected to an individual test pad. In this way, each test structure may be measureable individually.

For example, each test structure of the plurality of test structures may comprise a first portion of the conductive structure and a second portion of the conductive structure located at the first lateral wiring layer. Further, the first portion of the conductive structure of each respective test structure may be electrically connected to the second portion of the conductive structure of the respective test structure through a respective third portion located within the second lateral wiring layer or a third lateral wiring layer of the layer stack arranged above the first lateral wiring layer. The first portion of the conductive structure of each respective test structure may be electrically connected to a gate of a respective test transistor structure, a doping region of the respective test transistor structure or an electrode of a respective capacitor. For example, a sum of a lateral area occupied by the first portion of the conductive structure of a respective test structure and a lateral area occupied by the second portion of the conductive structure of the respective test structure may be at least larger than 10 times (or larger than 100 times, larger than 1000 or larger than 10000 times) a lateral area occupied by the gate of the respective test transistor structure.

The first lateral wiring layer may be a lower most lateral metal wiring layer (e.g. comprising aluminum, copper and/or tungsten) of the layer stack or a poly silicon layer of the layer stack. The lower most lateral metal wiring layer may be the lateral metal wiring layer of the layer stack of the semiconductor device 100 located closest to the semiconductor substrate 102. The poly silicon layer may be a poly silicon wiring layer or a poly silicon layer used for forming the gate of the test transistor structure, for example. In other words, the gate of the test transistor structure may be located within the poly silicon layer. The poly silicon layer may be located closer to the semiconductor substrate than a lower most lateral metal wiring layer of the layer stack of the semiconductor device 100. Therefore, using the lower most lateral metal wiring layer or another lateral metal wiring layer for implementing the first and second portion of the conductive structure of the first test structure may cause lower leakage currents towards the semiconductor substrate 102 during test measurements than using a poly silicon layer.

The test transistor structure may be a field effect transistor structure (e.g. metal-insulator-semiconductor field effect transistor MISFET or metal-oxide-semiconductor field effect transistor MOSFET) comprising a source doping region, a drain doping region and a gate electrode insulated from the semiconductor substrate 102 by a gate insulation layer (e.g. gate oxide) located between the gate electrode and the semiconductor substrate 102. The source doping region and the drain doping region may be embedded in a bulk semiconductor material of the semiconductor substrate 102 or in a well (e.g. n-doped or p-doped well) located in the semiconductor substrate 102. For example, a source doping region of the test transistor structure may be connected to a second test pad of the first test structure and a drain doping region of the test transistor structure may be connected to a third test pad of the first test structure, if the first test pad of the first test structure is connected to the gate of the test transistor structure. Alternatively, the gate of the test transistor structure may be connected to a second test pad of the first test structure and a second source/drain doping region of the test transistor structure may be connected to a third test pad of the first test structure, if the first test pad of the first test structure is connected to a first source/drain doping region of the test transistor structure.

Alternatively, the first portion of the conductive structure of the first test structure, the reference test structure and/or another test structure of a plurality of test structures may be electrically connected to an electrode (e.g. plate) of a capacitor. The capacitor may be a metal-insulator-semiconductor capacitor MISCAP or a metal-insulator-metal capacitor MIMCAP.

A lateral wiring layer (e.g. metal wiring layer or poly silicon layer of the layer stack of a semiconductor device) may be a layer for implementing lateral electrical connections between vertical electrical connections (vias) connecting lateral wiring layers. A vertical wiring layer (e.g. via layer of the layer stack of a semiconductor device) may be a layer for implementing vertical electrical connections (vias) between lateral wiring layers.

The layer stack of the semiconductor device 100 may comprise two or more lateral wiring layers, which are implemented by electrical conductive wiring portions embedded by insulating material (e.g. silicon dioxide, Phosphosilicate glass or Borophosphosilicate glass) and two or more vertical wiring layer, which is implemented by an insulation layer and electrical conductive vertical portions extending vertically through the insulation layer.

An electrical connection or an electrical conductive connection may mean an ohmic connection (e.g. without one or more pn-junctions or Schottky junctions) and two elements may be electrically connected, if an ohmic path exists between these elements, for example.

The semiconductor substrate 102 may be a silicon substrate or may be a wide band gap semiconductor substrate having a band gap larger than the band gap of silicon (1.1 eV). For example, the semiconductor substrate 102 may be a silicon carbide (SiC)-based semiconductor substrate, or gallium arsenide (GaAs)-based semiconductor substrate, or a gallium nitride (GaN)-based semiconductor substrate. The semiconductor substrate 102 may be a semiconductor wafer or a semiconductor die.

For example, the semiconductor device 100 may be a test device (e.g. test chip or test circuit) for characterization, verification and/or testing of a new manufacturing technology, a new manufacturing process, a new manufacturing tool and/or a new manufacturing site, for example. Alternatively, the semiconductor device 100 may be a semiconductor wafer comprising a plurality of integrated circuits (e.g. central processing units, microprocessors, memory devices, digital signal processors and/or power semiconductor devices) and the first test structure (or a plurality of test structures and/or a reference test structure) may be located in a kerf region, test region and/or a drop-in region of the semiconductor wafer.

Figure 2:
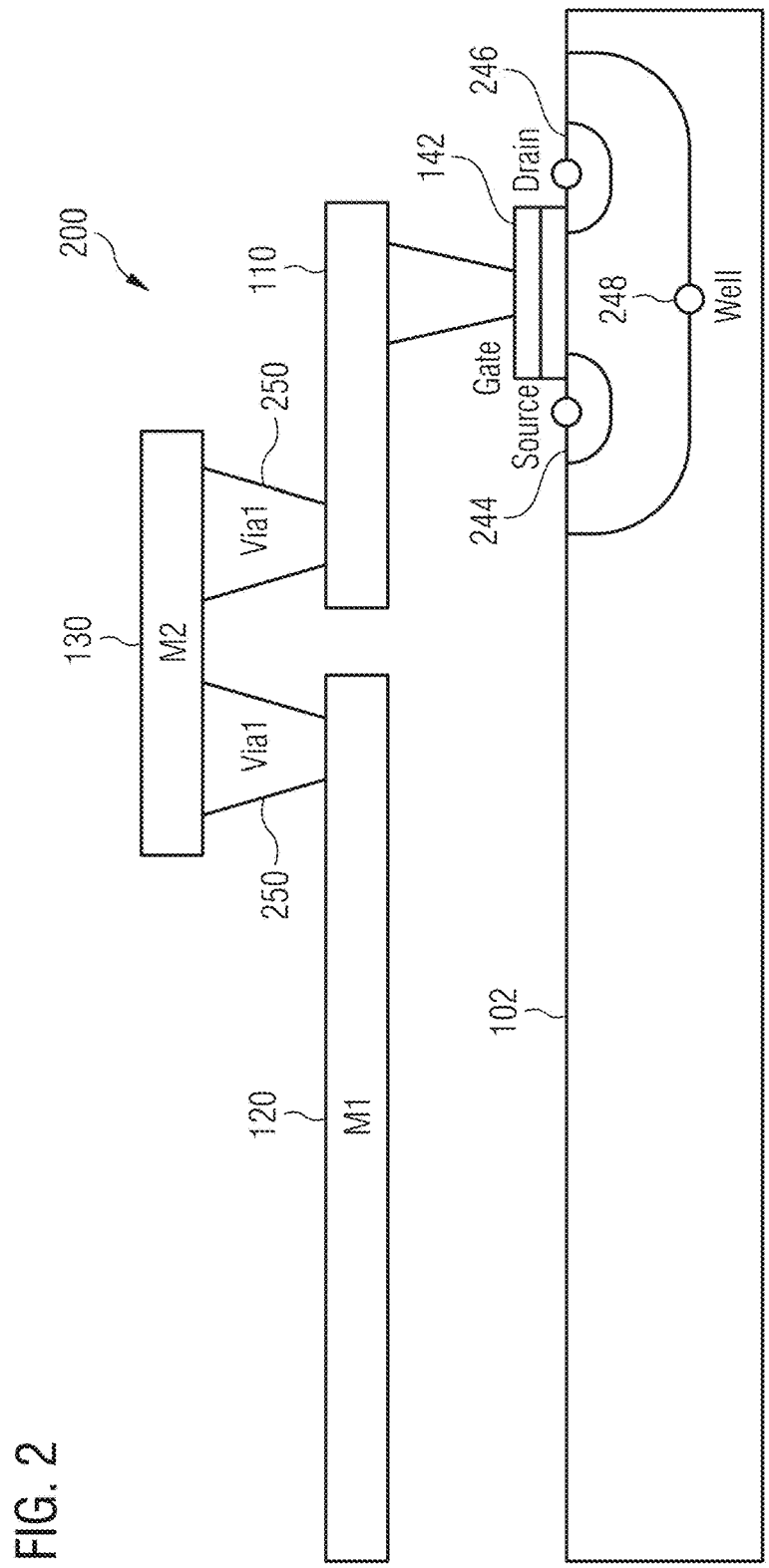
FIG. 2 shows a schematic cross section of a test structure of a semiconductor device.

FIG. 2 shows a schematic cross section of a test structure of a semiconductor device 200 according to an embodiment. The semiconductor device 200 is implemented similar to the semiconductor device described in connection with FIG. 1. The semiconductor device 200 comprises a first test structure comprising a conductive structure with a first portion 110 connected to a second portion 120 (located in a first metal layer M1) through a third portion 130 (located in a second metal layer M2) and vertical wiring portions 250 within a first vertical wiring layer (Via1) located vertically between the third portion 130 and the first and second portion. Further, the first test structure comprises a test transistor structure with a source doping region 244 and a drain doping region 246 embedded in a well 248 located in the semiconductor substrate of the semiconductor device 200. Additionally, the conductive structure of the first test structure comprises a vertical conductive contact portion between the first portion 110 and the gate 142 of the test transistor structure. The first portion 110 is connected (to the gate) during M1 processing and the second portion 120 is not connected (to the gate) during M1 processing, for example.

FIG. 2 may show a Stress-Optimized Antenna Device with the left part 120 of the antenna not connected to the gate oxide while M1 is processed. Only the right part 110 of the antenna may affect the oxide. After the complete wafer processing is finished, the whole M1 area is connected to the gate and it may act like one large area during electric stress of the gate oxide. The antennae are cut and reconnected ("bridged") through the conductor layer right above the active antenna layer. Alternatively, any layer above the active antenna layer may be used.

More details and aspects of the semiconductor device 200 are mentioned in connection with the proposed concept or one or more examples described above or below. The semiconductor device 200 may comprise one or more additional optional features corresponding to one or more aspects of the proposed concept or one or more examples described above (e.g. FIG. 1) or below (e.g. FIGS. 3a-11).

FIG. 3a shows a schematic cross section of a reference test structure of a semiconductor device 300 according to an embodiment. The semiconductor device 300 is implemented similar to the semiconductor device described in connection with FIGS. 1 and/or 2. The semiconductor device 300 comprises a reference test structure comprising a conductive structure with a first portion 310 connected to a second portion 320 (located in a first metal layer M1) through a third portion 330 (located in a third metal layer M3) and additional vertical wiring portions 350 within a first vertical wiring layer (Via1), lateral wiring portions 360 (located in a second metal layer M2) and vertical wiring portions 370 within a second vertical wiring layer (Via2). Further, the reference test structure comprises a reference transistor structure with a source doping region 344 and a drain doping region 346 embedded in a well 348 located in the semiconductor substrate 102 of the semiconductor device 300. Additionally, the conductive structure of the reference test structure comprises a vertical conductive contact portion between the first portion 310 and the gate 342 of the test transistor structure.

Figure 3B:
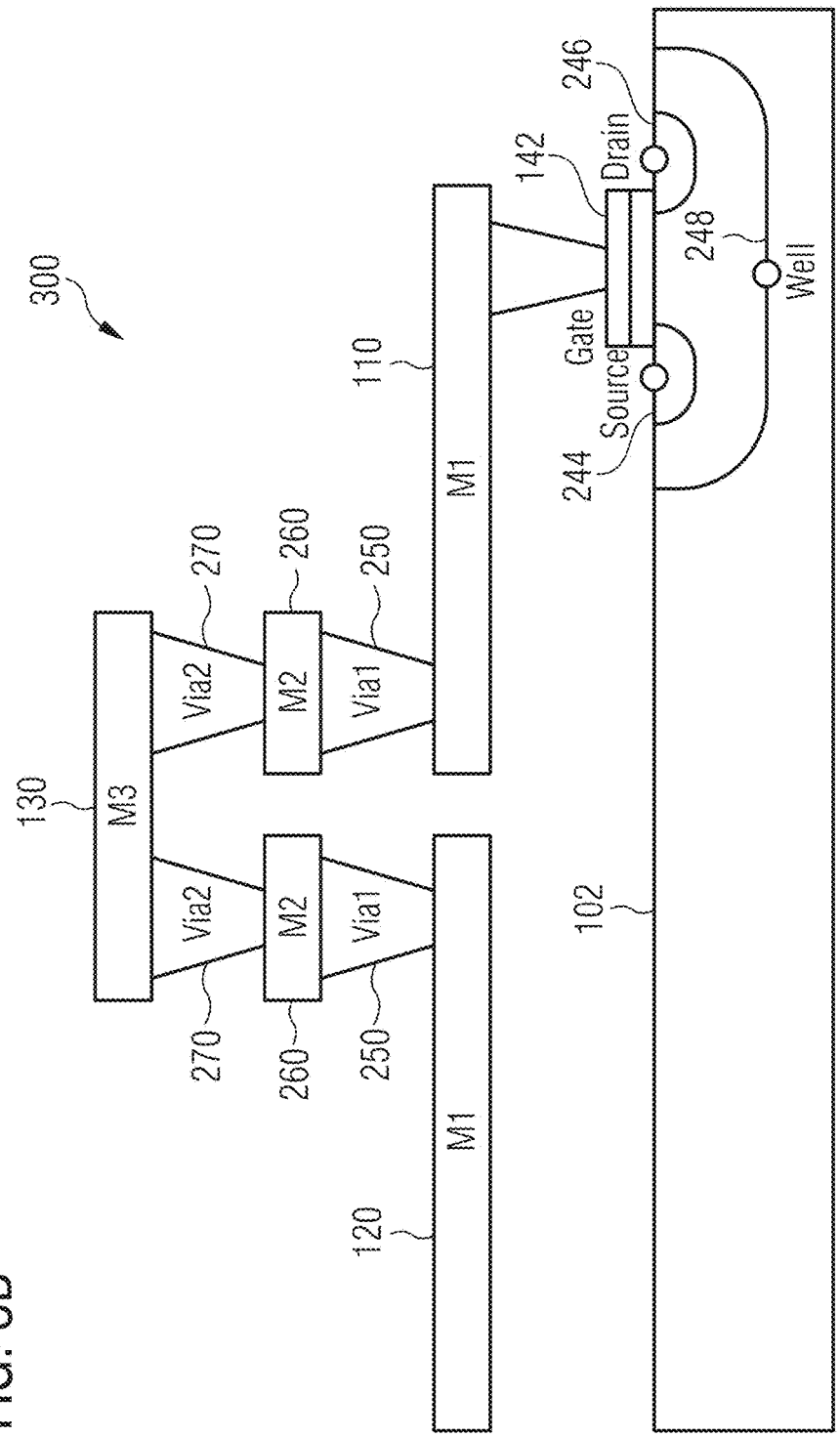

FIG. 3b shows a schematic cross section of a first test structure of the semiconductor device 300 shown in FIG. 3a. The first test structure of the semiconductor device 300 is implemented similar to the first test structure of the semiconductor device shown in FIG. 2, for example. However, the first portion 110 (e.g. antenna) is connected to the second portion 120 (located in the first metal layer M1) through the third portion 130 (located in the third metal layer M3) and additional vertical wiring portions 250 within the first vertical wiring layer (Via1), lateral wiring portions 260 (located in the second metal layer M2) and vertical wiring portions 270 within the second vertical wiring layer (Via2).

FIGS. 3a and 3b show an example of a test structure and a reference structure for testing plasma induced damages of gates of transistor structures due to the manufacturing of conductive portions manufactured in the first lateral wiring layer (first metal layer M1).

FIGS. 3a and 3b may show a Stress-Optimized Antenna Device proposed for metal1 qualification and monitoring with connection in another—higher—metal layer (FIG. 3b) and reference device to it (FIG. 3a). Instead of the layer just above the active antenna layer, a different layer (M3 in this example) above the active antenna layer (M1 in this example) is used to connect the active antenna area to the area optimizing stress behavior.

FIG. 3c shows a schematic cross section of an alternative first test structure of the semiconductor device shown in FIG. 3a. The alternative first test structure of the semiconductor device 300 is implemented similar to the first test structure shown in FIG. 3a. However, more than two portions of the conductive structure of the first test structure are located in the first lateral wiring layer and are connected to the first portion 110 through portions located in a lateral wiring layer above the first lateral wiring layer. For example, the second portion 120 (e.g. disconnected antenna) is connected to an additional portion 390 located in the second lateral wiring layer through vertical wiring portions 250 within the first vertical wiring layer (Via1), lateral wiring portions 260 (located in the second metal layer M2) and vertical wiring portions 270 within the second vertical wiring layer (Via2). The additional portion 390 located in the second lateral wiring layer is connected to an additional portion 380 located in the first lateral wiring layer through vertical wiring portions 250 within the first vertical wiring layer (Via1), lateral wiring portions 260 (located in the second metal layer M2) and vertical wiring portions 270 within the second vertical wiring layer (Via2). Further, the additional portion 380 located in the first lateral wiring layer is connected to the third portion 130 through vertical wiring portions 250 within the first vertical wiring layer (Via1), lateral wiring portions 260 (located in the second metal layer M2) and vertical wiring portions 270 within the second vertical wiring layer (Via2). The third portion 130 is connected to the first portion 110 (e.g. antenna) through vertical wiring portions 250 within the first vertical wiring layer (Via1), lateral wiring portions 260 (located in the second metal layer M2) and vertical wiring portions 270 within the second vertical wiring layer (Via2).

FIG. 3c shows an example of another connection, for example, by adding an additional part in the antenna layer between the antenna and the decoupled antenna.

More details and aspects of the semiconductor device 300 are mentioned in connection with the proposed concept or one or more examples described above or below. The semiconductor device 300 may comprise one or more additional optional features corresponding to one or more aspects of the proposed concept or one or more examples described above (e.g. FIGS. 1-2) or below (e.g. FIGS. 4a-11).

FIG. 4a shows a schematic cross section of a reference test structure (e.g. reference device) of a semiconductor device 400 according to an embodiment. The implementation of the semiconductor device 400 is similar to the semiconductor device described in connection with FIGS. 1, 2 and/or 3a and 3b. The reference test structure of the semiconductor device 400 is implemented similar to the reference test structure of the semiconductor device shown in FIG. 3a, for example. However, the first portion 310 is connected to the second portion 320 (located in a first metal layer M1) through the third portion 330 (located in a second metal layer M2) and additional vertical wiring portions 350 within a first vertical wiring layer (Via1).

FIG. 4b shows a schematic cross section of a first test structure (e.g. small antenna device) of the semiconductor device shown in FIG. 4a. The first test structure of the semiconductor device 400 is implemented similar or equal to the first test structure of the semiconductor device shown in FIG. 2, for example.

FIG. 4c shows a schematic cross section of a second or a largest test structure (e.g. large antenna device) of the semiconductor device 400 shown in FIG. 4a. For the test structure with the largest antenna effect test portion a single portion within the first lateral wiring layer may be sufficient without bridging through a lateral wiring layer above the first wiring layer, if the first lateral wiring layer is intended to be tested. The second or largest test structure of the semiconductor device 400 comprises a conductive portion 410 located within the first lateral wiring layer connected to the gate 442 of another test transistor structure with a source doping region 444 and a drain doping region 446 embedded in a well 448 located in the semiconductor substrate 102 of the semiconductor device 400.

FIGS. 4a-4c may show a set of Stress-Optimized Antenna Devices (stress-optimized qualification devices) proposed for metal1 qualification and used for analysis of PID damage from processing of metal1 or from its surrounding processed like inter metal dielectric deposition, for example.

The effect of the connection of most of the M1-antenna-area through M2 for the small antenna device (FIG. 4b) and for the connection of the whole (or nearly the whole) M1-antenna-area through M2 for the reference device (FIG. 4a) may be, that during the PID-critical processes for M1 like structuring or IMD-deposition (inter metal dielectric), the M1 antenna connected to the gate is (substantially) equal to other used test structures. The M1 area collecting the charge and being discharged through the gate oxide is (substantially) identical, for example. The remaining M1 area is not connected and is charged and slowly discharged through the IMD during processing, not affecting the gate oxide (e.g. also FIG. 2).

However, after the complete wafer fabrication the whole M1 antenna is connected for each device, for example. That may mean that during electrical stresses, the same amount of capacitive charging current and leakage current may flow into each device's M1 antenna, no matter which area was connected during processing. This may mean that the stress current that the oxides of reference and antenna devices experience may be (substantially) identical for all of them. The stress may be calibrated to a sensible low enough level after which the device parameter shift differences between each antenna device and its reference may represent the amount of oxide defects generated by plasma charging during processing quantitatively right.

The comparison of each device (test structures and reference structures) of FIGS. 4a-4c shows that they would react (substantially) identically to any electric measurement or stress as they are (substantially) equivalent in structure (except for the very small connection inside the antenna, which may show (nearly) no electrical difference). Only during the processing of the layer to be tested, the antenna area of that layer connected to the gate is different, for example.

More details and aspects of the semiconductor device 400 are mentioned in connection with the proposed concept or one or more examples described above or below. The semiconductor device 400 may comprise one or more additional optional features corresponding to one or more aspects of the proposed concept or one or more examples described above (e.g. FIGS. 1-3) or below (e.g. FIGS. 5-11).

Figure 5:
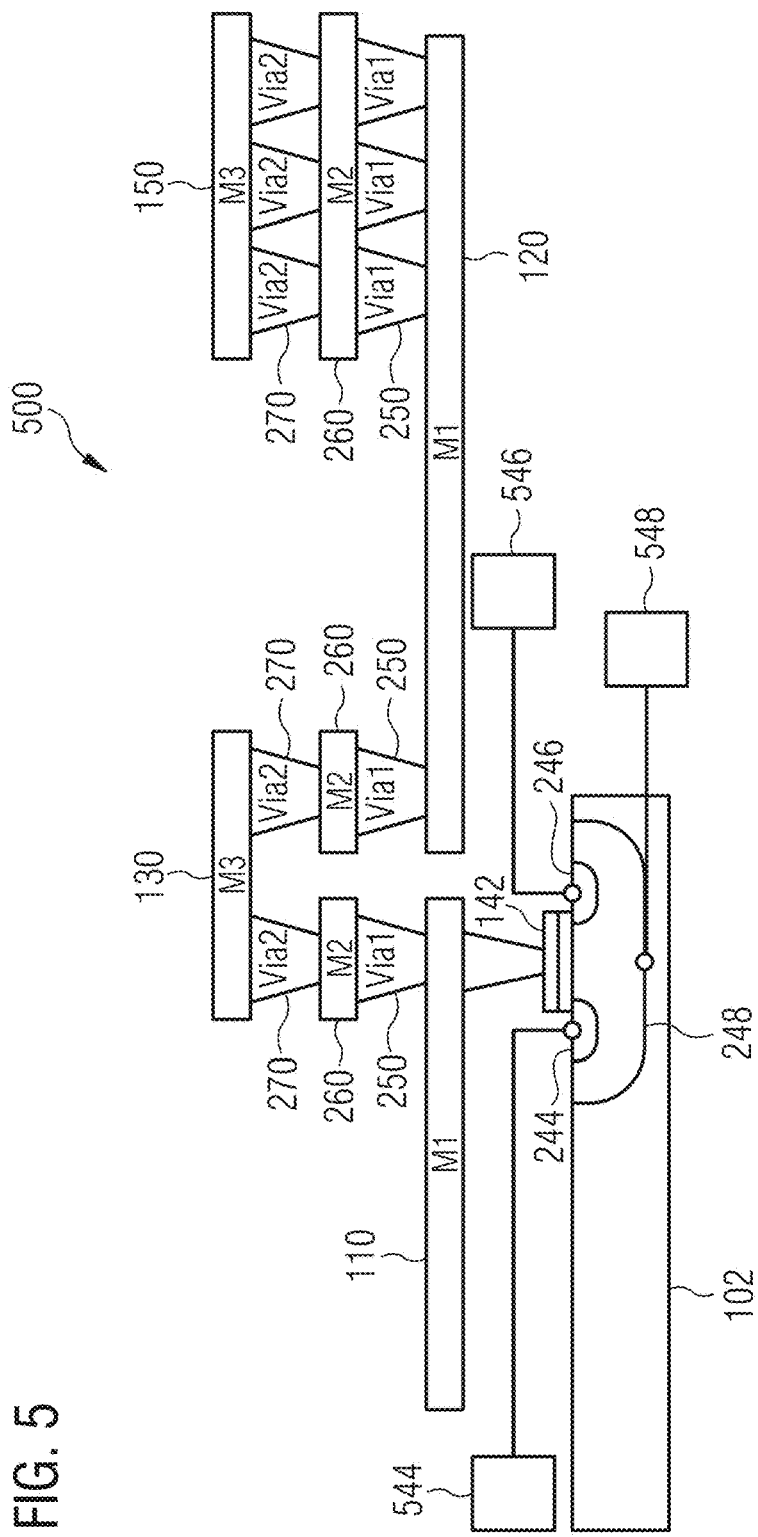
FIG. 5 shows a schematic cross section of a test structure of a semiconductor device.

FIG. 5 shows a schematic cross section of a test structure of a semiconductor device 500 according to an embodiment. The implementation of the semiconductor device 500 is similar to the semiconductor device described in connection with FIGS. 1, 2 and/or 3a and 3b, for example. The test structure of the semiconductor device 500 is implemented similar to the first test structure of the semiconductor device shown in FIG. 3b, for example. The first portion 110 represents an antenna effect test portion for the first lateral wiring layer (M1). The first test pad 150 (e.g. gate probing pad) is connected to the second portion 120 of the conductive structure of the test structure through vertical wiring portions 250 within a first vertical wiring layer (Via1), lateral wiring portions 260 (located in a second metal layer M2) and vertical wiring portions 270 within a second vertical wiring layer (Via2). Further, the source doping region 244 is connected to a second test pad 544 (e.g. source probing pad), the drain doping region 246 is connected to a third test pad 546 (e.g. drain probing pad) and the well 248 is connected to a fourth test pad (e.g. well probing pad) of the test structure.

For example, sets of test structures may comprise for each transistor (test transistor structure) a respective individual gate, source, drain and well probing pad. The gates may be connected to the probing pads by a bridge at the highest metal layer close to the gates to avoid or reduce charging due to the pad processing.

More details and aspects of the semiconductor device 500 are mentioned in connection with the proposed concept or one or more examples described above or below. The semiconductor device 500 may comprise one or more additional optional features corresponding to one or more aspects of the proposed concept or one or more examples described above (e.g. FIGS. 1-4c) or below (e.g. FIGS. 6a-11).

Figure 6A:
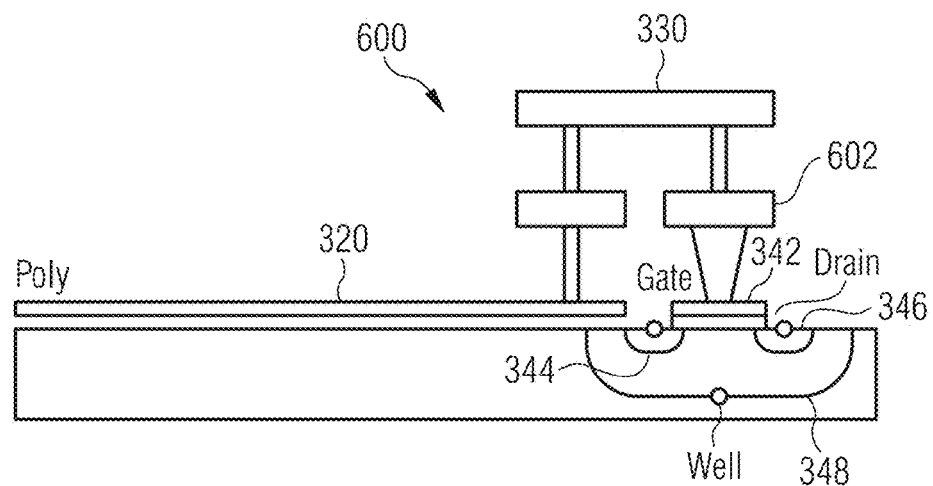
FIG. 6a shows a schematic cross section of a reference test structure of a semiconductor device with a shielding structure within a poly silicon layer.

FIG. 6a shows a schematic cross section of a reference test structure of a semiconductor device 600 with a shielding structure within a poly silicon layer according to an embodiment. The implementation of the semiconductor device 600 is similar to the semiconductor device described in connection with FIG. 1, for example. The first and second portions of the conductive structures of the reference test structure are located in a different layer (first lateral wiring layer) than a layer intended to be tested for plasma induced damages. The first lateral wiring layer is a polysilicon layer used to form the gate electrode. The first portion of the conductive structure of the reference test structure is represented by the gate 342 of the reference transistor structure of the reference test structure and insulated from the semiconductor substrate by the gate insulation (e.g. gate oxide). The second portion 320 of the conductive structure of the reference test structure is formed by a portion of the polysilicon layer as well and is insulated from the semiconductor substrate by a field insulation (e.g. field oxide) thicker than the gate insulation. Further, the first portion 342 is connected to the second portion 320 through a third portion 330 of the conductive structure of the reference test structure located above the first lateral wiring layer and above an antenna effect test portion 602 of the conductive structure of the reference test structure located in a lateral wiring layer (e.g. first metal layer M1) located vertically between the first lateral wiring layer (polysilicon layer) and the third portion 330.

Figure 6B:
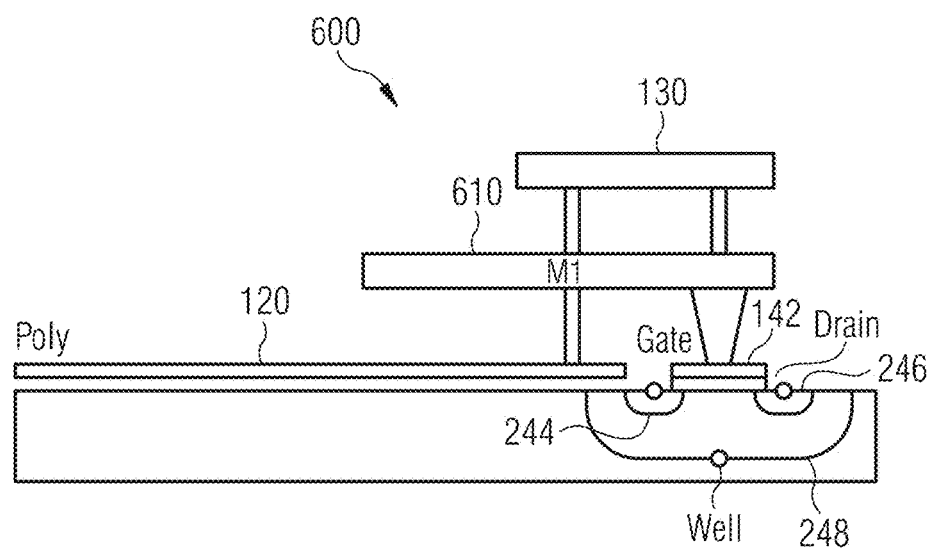

FIG. 6b shows a schematic cross section of a first test structure of the semiconductor device shown in FIG. 6a. The first and second portions of the conductive structures of the first test structure are located in the first lateral wiring layer as well. The first portion 110 of the conductive structure of the first test structure is represented by the gate 142 of the test transistor structure of the first test structure and insulated from the semiconductor substrate 102 by the gate insulation (e.g. gate oxide). The second portion 120 of the conductive structure of the first test structure is formed by a portion of the polysilicon layer as well and is insulated from the semiconductor substrate 102 by the field insulation (e.g. field oxide) thicker than the gate insulation. Further, the first portion 142 is connected to the second portion 120 through a third portion 130 of the conductive structure of the first test structure located above the first lateral wiring layer and above an antenna effect test portion 610 (antenna) of the conductive structure of the first test structure located in a lateral wiring layer (e.g. first metal layer M1) located vertically between the first lateral wiring layer (polysilicon layer) and the third portion 130.

A use of an additional poly area (or any other metal area below the active antenna layer) on the gate of every device may also improve the stress behavior, as leakage and capacitive charging currents would mainly flow into this poly (metal) plate (e.g. FIGS. 6a and 6b). The stress difference to the oxides due to variation of active antenna size may be strongly reduced. Only capacitive charging and leakage currents towards the side (laterally) of the antenna may cause a small difference in oxide stress between devices of different active antenna size. The poly plate may be connected in a metal layer higher than the antenna layer to be tested, as it may otherwise mask the charging damage from the antenna processing.

FIGS. 6a and 6b may show a device with improved stress behavior that can be used for metal1 PID detection (FIG. 6b). A poly plate larger than (or larger than 50%) the largest antenna area is placed under each antenna and connected to the device gate in poly for each antenna size and for the reference device (FIG. 6a).

More details and aspects of the semiconductor device 600 are mentioned in connection with the proposed concept or one or more examples described above or below. The semiconductor device 600 may comprise one or more additional optional features corresponding to one or more aspects of the proposed concept or one or more examples described above (e.g. FIGS. 1-5) or below (e.g. FIGS. 7a-11).

FIG. 7a shows a schematic cross section of a reference test structure of a semiconductor device 700 with a shielding structure within a lower most lateral metal wiring layer according to an embodiment. The implementation of the semiconductor device 700 is similar to the semiconductor device described in connection with FIG. 1, for example. The first and second portions of the conductive structures of the reference test structure are located in a different layer (first lateral wiring layer) than a layer intended to be tested for plasma induced damages. The first lateral wiring layer is a lower most lateral metal wiring layer of the layer stack of the semiconductor device 700. The first portion 310 is connected to the second portion 320 through a third portion 330 of the conductive structure of the reference test structure located above the first lateral wiring layer and above an antenna effect test portion 602 of the conductive structure of the reference test structure located in a lateral wiring layer (e.g. third metal layer M3) located vertically between the first lateral wiring layer and the lateral wiring layer (e.g. third metal layer M4) containing the third portion 330.

FIG. 7b shows a schematic cross section of a first test structure of the semiconductor device shown in FIG. 7a. The first and second portions of the conductive structures of the first test structure are located in the first lateral wiring layer as well. The first portion 110 is connected to the second portion 120 through a third portion 130 of the conductive structure of the first test structure located above the first lateral wiring layer and above an antenna effect test portion 610 (antenna) of the conductive structure of the first test structure located in the lateral wiring layer (e.g. first metal layer M3) located vertically between the first lateral wiring layer (polysilicon layer) and the lateral wiring layer (e.g. third metal layer M4) containing the third portion 130.

FIGS. 7a and 7b show another variant of the device with a poly plate in FIGS. 6a and 6b. An M1 plate is used instead of a poly plate. Like in the poly case the M1 plate is connected in a metal layer higher than the antenna layer to be tested, as it may otherwise mask the charging damage from the antenna processing.

FIGS. 7a and 7b may show a device with improved stress behavior that can be used for metal3 PID detection (FIG. 7b). An M1 plate larger than the largest antenna area is placed under each antenna and connected to the device gate in M1 or poly for each antenna size and for the reference device (FIG. 7a).

More details and aspects of the semiconductor device 700 are mentioned in connection with the proposed concept or one or more examples described above or below. The semiconductor device 700 may comprise one or more additional optional features corresponding to one or more aspects of the proposed concept or one or more examples described above (e.g. FIGS. 1-6b) or below (e.g. FIGS. 8-11).

Figure 8:
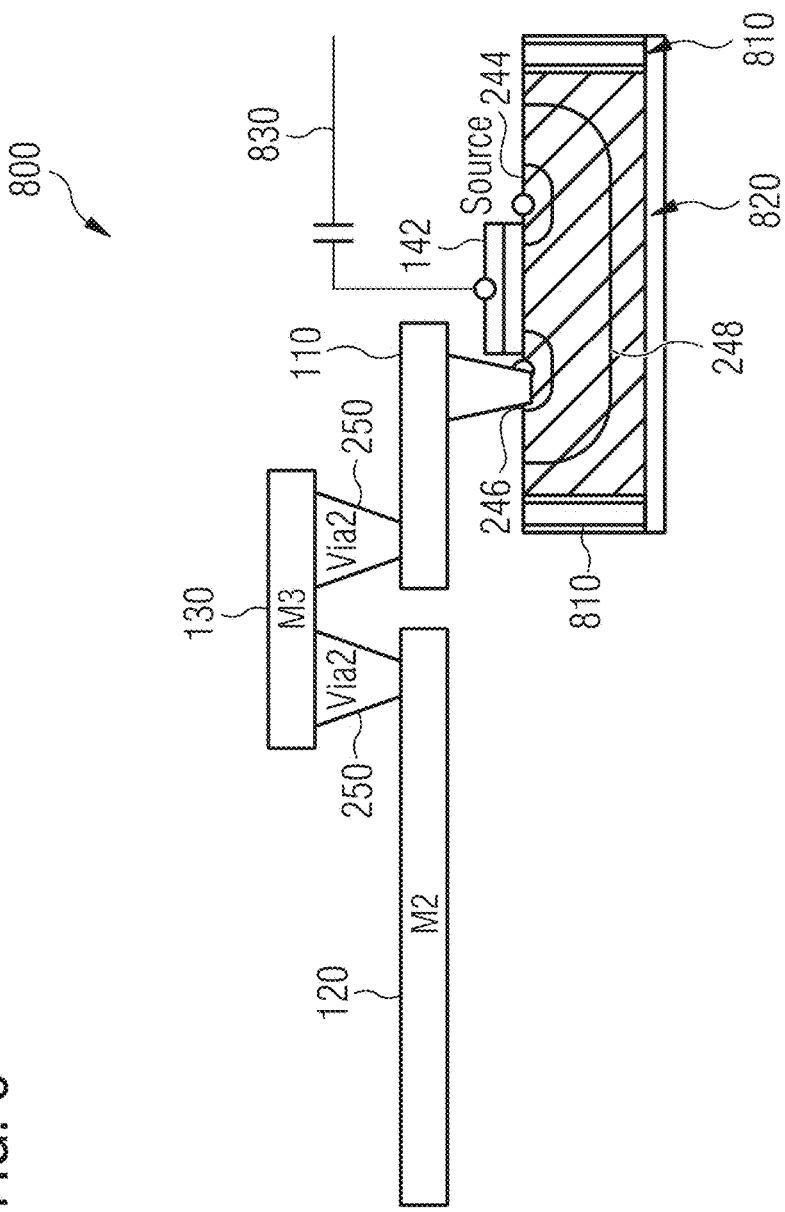
FIG. 8 shows a schematic cross section of a test structure of a semiconductor device connected to a doping region of a test transistor structure.

FIG. 8 shows a schematic cross section of a test structure of a semiconductor device 800 connected to a doping region of a test transistor structure according to an embodiment. The implementation of the semiconductor device 800 is similar to the semiconductor device described in connection with FIG. 2, for example. However, the (first) lateral wiring layer containing the first portion 110 and the second portion 120 of the conductive structure of the first test structure is located in the second metal layer M2 and the conductive structure of the first test structure is connected to the drain doping region (e.g. alternatively the source doping region) of the test transistor structure. In this way, the doping region and/or the well of the test transistor structure may be charged during forming the first portion 110 of the conductive structure of the first test structure and a plasma damage in the gate insulation may occur. The well 248 may be located in a portion of the semiconductor substrate (e.g. this area may be charged; well area) insulated from other parts by a buried insulation layer 820 (e.g. silicon dioxide or highly doped epitaxial layer) and laterally surrounding insulation trenches 810. The gate may be connected in M1 to others parts 830 of the circuit, for example.

Figure 9:
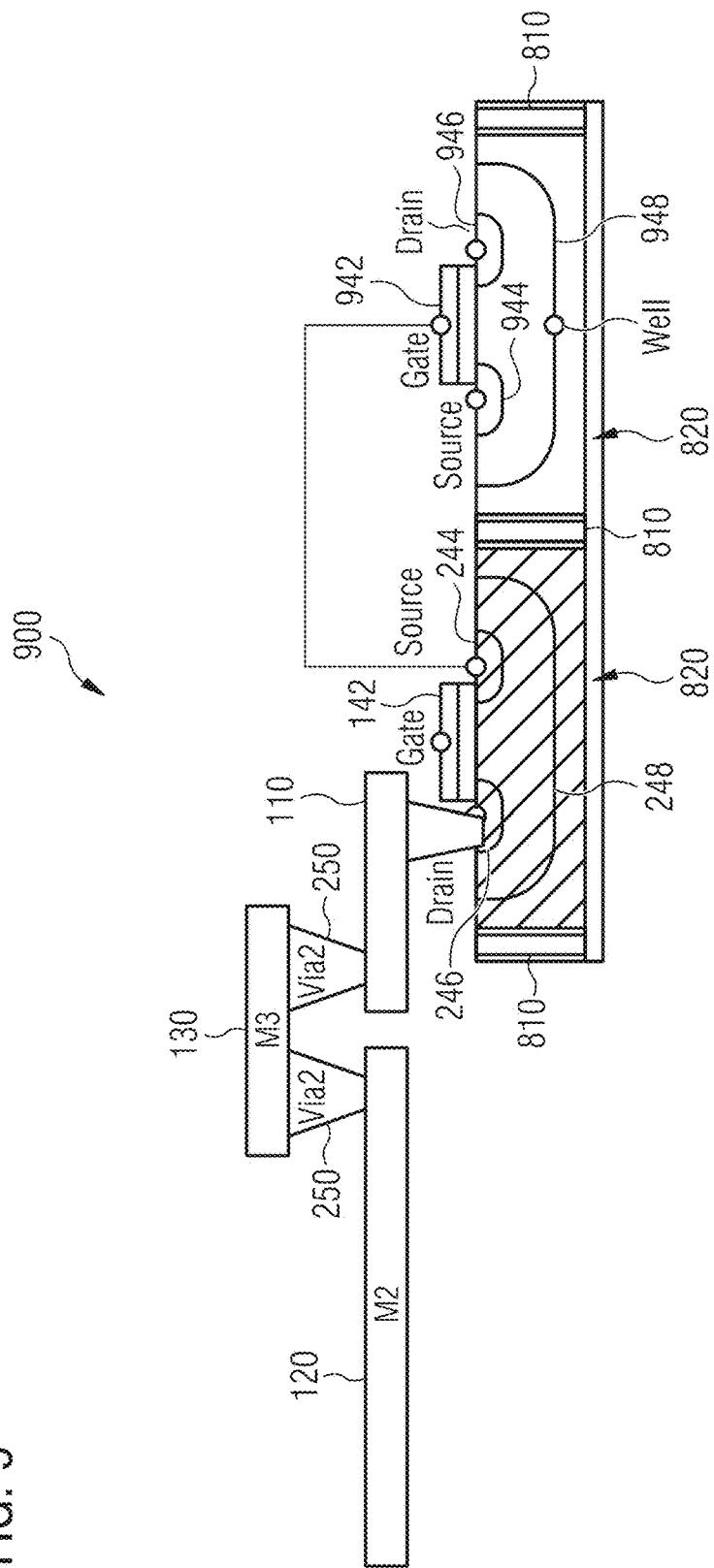
FIG. 9 shows a schematic cross section of a test structure of another semiconductor device connected to a doping region of a test transistor structure.
Figure 10:
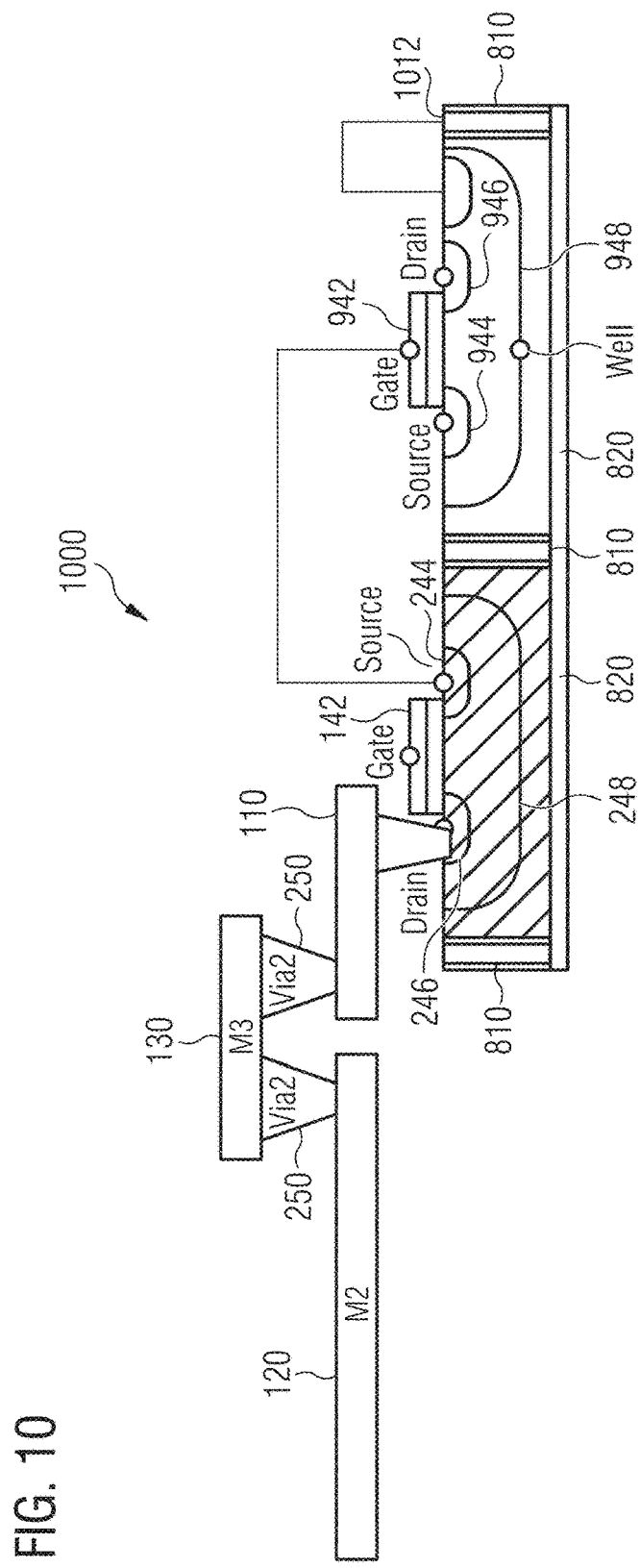
FIG. 10 shows a schematic cross section of a test structure of another semiconductor device connected to a doping region of a test transistor structure.

In technologies with strong transistor area isolation, for example, by triple wells or deep trench isolations with additional buried layer, also damage to gate oxides from charging of transistor wells may be analyzed in qualifications and may be monitored. The proposed antenna structure may be applied in these cases, when it is not connected directly to the gate of a test structure as well. FIGS. 8-10 show some cases of charging which may be covered in qualifications which may use a proposed antenna structure.

FIG. 8 may show a stress-optimized antenna device proposed for metal2 qualification for same well plasma processed induced damage to the gate oxide of the device, for example.

More details and aspects of the semiconductor device 800 are mentioned in connection with the proposed concept or one or more examples described above or below. The semiconductor device 800 may comprise one or more additional optional features corresponding to one or more aspects of the proposed concept or one or more examples described above (e.g. FIGS. 1-7b) or below (e.g. FIGS. 9-11).

FIG. 9 shows a schematic cross section of a test structure of a semiconductor device 900 connected to a doping region of a test transistor structure according to an embodiment. The implementation of the semiconductor device 900 is similar to the semiconductor device described in connection with FIG. 8, for example. Additionally, the source doping region 244 of the test transistor structure (e.g. array field effect transistor FET) is connected to a gate 942 of a monitor field effect transistor structure comprising a source doping region 944, a drain doping region 946 and a well doping region 948 located in a portion of the semiconductor substrate insulated from the test transistor structure. A plasma damage in the gate oxide of the monitor field effect transistor structure may occur due to charging of the well area of the test transistor structure.

A well antenna structure with connection is shown. In some test structures, the right well 948 should be dischargeable or may comprise a large area so that it does not easily float up with the charged gate in the charging case, for example. In a product, other parts of a circuit may be connected to the well. For a specific test structure, a connection of the well with a contact to the substrate (e.g. FIG. 10) may be implemented depending on the technology, for example.

FIG. 9 may show a stress-optimized antenna device proposed for metal2 qualification for remote well plasma process induced damage to the gate oxide of the device on the right from charging of the isolated well area on the left, for example.

More details and aspects of the semiconductor device 900 are mentioned in connection with the proposed concept or one or more examples described above or below. The semiconductor device 900 may comprise one or more additional optional features corresponding to one or more aspects of the proposed concept or one or more examples described above (e.g. FIGS. 1-8) or below (e.g. FIGS. 10-11).

FIG. 10 shows a schematic cross section of a test structure of a semiconductor device 1000 connected to a doping region of a test transistor structure according to an embodiment. The implementation of the semiconductor device 1000 is similar to the semiconductor device described in connection with FIG. 9, for example. Additionally, the well 948 of the monitor field effect transistor structure is connected to an electrically conductive filling 1012 (e.g. polysilicon) of an insulation trench 810. The electrically conductive filling 1012 may be connected to the semiconductor substrate or the buried insulation layer. Such a connection may be implemented at a technology, which uses a deep trench with poly filling for side insulation and which may use a highly doped epitaxial layer for the lower insulation.

More details and aspects of the semiconductor device 1000 are mentioned in connection with the proposed concept or one or more examples described above or below. The semiconductor device 1000 may comprise one or more additional optional features corresponding to one or more aspects of the proposed concept or one or more examples described above (e.g. FIGS. 1-9) or below (e.g. FIG. 11).

Figure 11:
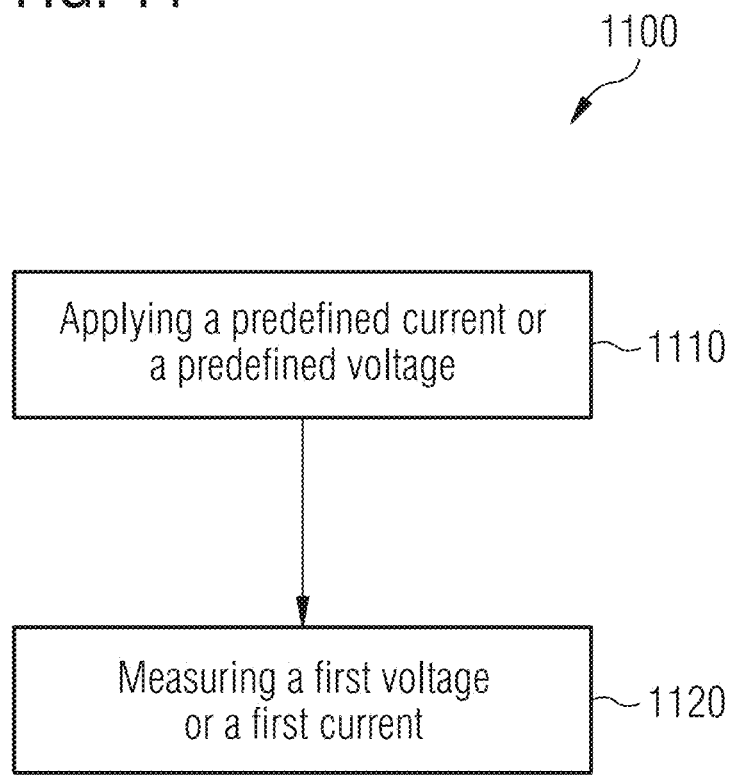
FIG. 11 shows a flow chart of a method for testing a gate insulation of a transistor structure.

FIG. 11 shows a flow chart of a method for testing a gate insulation of a transistor structure according to an embodiment. The method 1100 comprises applying 1110 a predefined current or a predefined voltage between a first test pad and a second test pad of a first test structure of a semiconductor device. The first test pad is connected to a gate of a test transistor structure or a doping region of the test transistor structure through a conductive structure located within a layer stack of the semiconductor device. The conductive structure of the first test structure comprises a first portion of the conductive structure and a second portion of the conductive structure located in a first lateral wiring layer of the layer stack. Further, the first portion of the conductive structure of the first test structure is electrically connected to the second portion of the conductive structure of the first test structure via a third portion located in a second lateral wiring layer of the layer stack arranged above the first lateral wiring layer. Additionally, the method 1100 comprises measuring 1120 a first voltage between the first test pad and the second test pad of the first test structure during applying the predefined current or a first current between the first test pad and the second test pad of the first test structure during applying the predefined voltage.

By applying a predefined current or a predefined voltage between a gate and a doping region of a transistor structure of a test transistor structure and measuring a corresponding voltage or current, a gate insulation damage may be detectable. By connecting a portion of a conductive structure to a gate or doping region of a test transistor structure through a wiring layer located above this portion, a plasma induced charging of the gate or a well embedding the doping region of the test transistor during manufacturing of the conductive structure can be avoided. Further, this portion together with a portion of the conductive structure connected directly to the gate or doping region may cause a leakage current towards the semiconductor substrate during test measurements, which may be in the same range as a leakage current of other test and/or reference structures. In this way, a more accurate and/or more reliable determination of differences between different test and/or reference structures may be enabled.

The measured first voltage or first current may be compared to a measured voltage or current of one or more other test structures and/or a reference test structure.

For example, the method 1100 may further comprises applying the predefined current or the predefined voltage between a first test pad and a second test pad of a reference test structure of a semiconductor device. The first test pad may be connected to a gate of a reference transistor structure or a doping region of the reference transistor structure through a conductive structure located within the layer stack of the semiconductor device. Further, the conductive structure of the reference test structure may comprise a first portion of the conductive structure and a second portion of the conductive structure located within the first lateral wiring layer. Additionally, the first portion of the conductive structure of the reference test structure may be electrically connected to the second portion of the conductive structure of the reference test structure via a third portion located within the second lateral wiring layer or a third lateral wiring layer of the layer stack arranged above the first lateral wiring layer. Further, the method 1100 may comprise measuring a reference voltage between the first test pad and the second test pad of the reference test structure during applying the predefined current or a reference current between the first test pad and the second test pad of the reference test structure during applying the predefined voltage.

For example, the first voltage and the reference voltage may be compared to detect a plasma induced damage at the first test structure and/or comparing the first current and the reference current may be compared to detect a plasma induced damage at the first test structure.

More details and aspects of the method 1100 are mentioned in connection with the proposed concept or one or more examples described above or below. The method 1100 may comprise one or more additional optional features corresponding to one or more aspects of the proposed concept or one or more examples described above (e.g. FIGS. 1-10) or below.

Some embodiments relate to a method for forming a semiconductor device. The method comprises forming a first test structure of the semiconductor device. The first test structure comprises a first portion of a conductive structure and a second portion of the conductive structure located within a first lateral wiring layer of a layer stack of the semiconductor device. The first portion of the conductive structure of the first test structure is electrically connected to the second portion of the conductive structure of the first test structure through a third portion located within a second lateral wiring layer of the layer stack arranged above the first lateral wiring layer. Further, the first portion of the conductive structure of the first test structure is electrically connected to a gate of a test transistor structure or a doping region of the test transistor structure. Additionally, the first portion of the conductive structure of the first test structure is electrically connected to a first test pad of the first test structure. A sum of a lateral area occupied by the first portion of the conductive structure of the first test structure and a lateral area occupied by the second portion of the conductive structure of the first test structure is at least larger than 10 times a lateral area occupied by the gate of the test transistor structure or at least larger than a lateral area occupied by a well embedding doping regions of the test transistor structure.

More details and aspects of the method are mentioned in connection with the proposed concept or one or more examples described above or below. The method for forming a semiconductor device may comprise one or more additional optional features corresponding to one or more aspects of the proposed concept or one or more examples described above (e.g. FIGS. 1-11) or below.

Some embodiments relate to Stress-Optimized Antenna Test Structures for Plasma Process Induced Damage Reliability.

To prevent the damage, design rules limiting poly, contact, metal and via areas in products may be ensured by Design Rule Checks (DRCs). These rules may be defined and verified in technology reliability qualifications for Plasma Process Induced Damage (PID). For these qualifications, test structures with varying poly, contact, metal and via areas with defined shape ("antennae") on gates (or in technologies with strong isolations also on wells) of transistors may be placed on test chips. Standard device parameters may be measured, a stress may be performed and the shift of the device parameters may be determined. These parameters and shifts may be then compared for the device with the antenna on the gate to a reference device, which may be identical except for not having any (or only a small) antenna connected. Differences between the devices can be attributed to charging effects from processing of the layer(s) that the antenna comprises. With the specification of maximum allowed parameter and shifts differences due to charging, the antenna design rules may be determined. The stress may be applied to identify risks that can occur not at zero hour, but during product lifetime, in form of device parameter shifts, for example.

A hot carrier stress or bias temperature stress (which should have the same problem to a smaller degree due to its high gate voltages) may be used for single test structures. Due to their long stress time requirements, both stress types cannot be used for the full set of structures used in a technology reliability qualification and even less for reliability monitoring (when using other test concepts), for example.

Plasma charging effects may be very localized on the wafer surfaces, so a large number of dies may be measured on enough wafers (e.g. at least 3 wafers each from 3 lots according to AEC-Q100 standard). Depending on the number of the metal layers and the number of different devices and gate oxide types, hundreds of test structures may be measured. For example, a stress type that may be both fast enough to be used on such a large number of devices and physically sensible is a so-called analytic stress. For this stress, a constant current density may be sent for a defined stress time through the gate oxide to recharge trap states originating from defects. For this, an algorithm may apply and control a force voltage on the gate contact for the defined time.

For example, the antenna device and reference device oxides should experience (substantially) identical current densities to obtain quantitative values for device damage from charging effects.

However, the antenna itself may change the stress experienced by the device oxide. It may form a capacitive element with its surrounding and the substrate as well as a leakage path towards the substrate (when using other test concepts). In case of the short analytic stress used for qualifications, a part of the current forced in at the gate may flow into the antenna and not through the gate oxide. In the beginning of the stress, a current proportional to antenna capacity and voltage ramp speed may flow into the antenna. During stress, a leakage current proportional to voltage may flow into the antenna. Both currents may scale proportionally to antenna size (when using other test concepts). This may mean that the larger the antenna is, the smaller the real stress current experienced by the oxide may be. If this effect becomes too dominant, antenna devices cannot be compared to their reference device and a reliability analysis might not be possible (when using other test concepts), for example.

In PID qualifications or fWLR (fast wafer level reliability) monitoring, a higher stress current may be used to reduce the problem. For example, the antenna current does not scale with total stress current, so the difference in real stress experienced by the oxide of antenna and reference device may become smaller. However, the stress current may be limited by oxide breakdown and measurability of the transistor parameters. For thicker oxides (e.g. oxides with 25 nm thickness), it might not be possible to increase the stress so far that the antenna current becomes negligible (when using other test concepts).

An aspect of the proposed concept may be to create a set of test devices in which each device reacts to process charging exactly (or substantially equal) like a product device with identical antenna area, and in which set each device electrically experiences an (substantially) identical oxide stress current independently of active antenna size during technology qualification or monitoring measurements.

These proposed PID test structures may be created by connecting to qualification devices (substantially) identical antenna areas of the layer to be tested on all devices and on their reference and by additionally cutting different proportions of this area for each device and reconnecting it in a higher (=later processed) conductor layer.

According to an aspect, an improvement of the test structures which are used for qualification and monitoring is proposed. To each device of one antenna type—including the reference device—an identical antenna of large size may be connected. This antenna may then be cut to the size intended for the antenna area of this processed layer to be checked in this structure and then electrically connected again through a higher metal layer.

A set of qualification devices (e.g. FIGS. 4a-4c) may be used for analysis of PID damage from processing of the antenna layer or from its surrounding processes like inter metal dielectric deposition. The antenna may couple capacitively to the substrate and neighboring layers and also may form a leakage path towards the substrate.

The proposed concept may be an option to ensure reliability with respect to PID for semiconductor technologies for thicker oxides. Antenna design rules for thicker oxides can be set more precisely, for example. Due to this, products may either be more robust against process charging on devices with thicker gate oxides than other products or alternatively, product size may be reduced due to larger antenna areas being allowed in the products for thick oxide devices without the need to use a tie down diode as protection against PID.

The proposed concept may enable a better robustness and a better reliability towards plasma charging damage, as it may provide a superior set of test structures together with a superior measurement and analysis methodology for detection of PID in qualifications as well as in fWLR monitoring. The proposed concept may cover both whole fields of technology reliability qualification for PID and reliability monitoring for PID, for example. The proposed stress-optimized antenna test structures for plasma process induced damage reliability might give additional security for semiconductor manufacturers, as the structure may be used for every aspect of PID detection. It may cover all test structures necessary for technology reliability qualifications and monitoring regarding PID.

Proposed test structures may be located in the kerf or in drop-ins of product wafers or test wafers, for example.

For example, Technology reliability qualification measurements for a semiconductor manufacturing technology may be based on proposed test structures (e.g. on 25 nm oxide antenna devices). To detect the amount of neutral defects caused by processing of the antenna layers (e.g. M3), the stress currents (e.g. between $1*10^{-11}$ A and $5*10^{-10}$ A for n-MOS and between $5*10^{-11}$ A and $5*10^{-10}$ A for p-MOS) may be applied cumulatively for is each at the gate contact, for example. An algorithm may control the gate voltage to force the constant currents on the gate.

To determine possible oxide fails and to detect stress reproducibility, the force voltage at the end of the stress may be recorded and plotted for several stress levels for NMOS devices with M3 antennae. For example, an antenna ratio of AR=500 may be used and may mean a pure metal area of 500 µm2 for a device type with 1 µm*1 µm channel area.

To detect the amount of recharged neutral defects, the drift in threshold voltage Vt with respect to its zero hour value may be determined after each stress level. The difference between the drift of an antenna device and the drift of the reference device may give the amount of defects. The remaining threshold voltage drift may be caused by the electric stress itself (when using other test concepts). For example, a result of a large current into the antenna for larger antenna devices may be a lower oxide stress current, which may also cause a smaller drift in Vt.

For lower stress currents, the stress voltage at end of stress may be reduced for devices with larger gate antenna. This may mean that the stress current level was reached at a smaller voltage applied, because a part of the current is flowing into the antenna and not through the oxide (when using other test concepts). This part may be larger for larger antenna sizes. The threshold voltage after the stress may be measurable. However, the drift in threshold voltage may show that the oxides of the devices with larger antennae may see almost no stress, so that their drift may be almost zero. For example, an AR=150 device (e.g. which may be in the range of allowed values in the products for this device type) may have a critical amount of neutral PID defects in the oxide. These defects cannot be determined by comparison to the reference device based on other test concepts, as the device oxide was stressed weaker than the reference oxide, for example.

For the higher stress currents, the stress voltage at end of stress may be identical for all devices. This may mean that the stress to the oxides may be identical. For these large currents, the currents into the antennae may be smaller in proportion to the oxide currents (when using other test concepts). However, the threshold voltages of the devices cannot be determined any more after these high stress levels, for example. After a specific level, only few die values may be left. After a higher level, no single device may have a measurable threshold voltage, if measured based on another test concept. The proposed test concept may enable to increase the accuracy and/or reliability for testing such devices.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
   a first test structure, wherein
      the first test structure comprises a first portion of a conductive structure and a second portion of the conductive structure located within a first lateral wiring layer of a layer stack of the semiconductor device,
      the first portion of the conductive structure of the first test structure is electrically connected to the second portion of the conductive structure of the first test structure through a third portion located within a second lateral wiring layer of the layer stack arranged above the first lateral wiring layer,
      the first portion of the conductive structure of the first test structure is electrically connected to a gate of a test transistor structure, a doping region of the test transistor structure or an electrode of a test capacitor,
      the first portion of the conductive structure of the first test structure is electrically connected to a first test pad of the first test structure, and
      a sum of a lateral area occupied by the first portion of the conductive structure of the first test structure and a lateral area occupied by the second portion of the conductive structure of the first test structure is at least larger than 10 times a lateral area occupied by the gate of the test transistor structure or the electrode of the test capacitor; and
   a reference test structure comprising a first portion of a conductive structure and a second portion of the conductive structure located within the first lateral wiring layer, wherein
      the first portion of the conductive structure of the reference test structure is electrically connected to the second portion of the conductive structure of the reference test structure through a third portion located within the second lateral wiring layer or a third lateral wiring layer of the layer stack arranged above the first lateral wiring layer,
      the first portion of the conductive structure of the reference test structure is electrically connected to a gate of a reference transistor structure, a doping region of the reference transistor structure or an electrode of a reference capacitor, wherein the first portion of the conductive structure of the reference test structure is electrically connected to a first test pad of the reference test structure,
      a sum of a lateral area occupied by the first portion of the conductive structure of the reference test structure and a lateral area occupied by the second portion of the conductive structure of the reference test structure is at least larger than 10 times a lateral area occupied by the gate of the test transistor structure or the electrode of the test capacitor, a lateral area occupied by an antenna effect test portion of the conductive structure of the first test structure is at least 10% larger than a lateral area occupied by an antenna effect test portion of the conductive structure of the reference test structure, and the antenna effect test portion of the conductive structure of the first test structure and the antenna effect test portion of the conductive structure of the reference test structure are located within the same wiring layer.

2. The semiconductor device according to claim 1, wherein the antenna effect test portion of the conductive structure of the first test structure and the antenna effect test portion of the conductive structure of the reference test structure are located within a wiring layer above the first lateral wiring layer.

3. The semiconductor device according to claim 2, wherein a lateral area occupied by the first portion of the conductive structure of the first test structure differs by less than 20% from a lateral area occupied by the first portion of the conductive structure of the reference test structure.

4. The semiconductor device according to claim 1, wherein:
the antenna effect test portion of the conductive structure of the first test structure is represented by the first portion of the conductive structure of the first test structure; and
the antenna effect test portion of the conductive structure of the reference test structure is represented by the first portion of the conductive structure of the first test structure.

5. A semiconductor device comprising a plurality of test structures, wherein:
the plurality of test structures includes a first test structure;
the first test structure comprises a first portion of a conductive structure and a second portion of the conductive structure located within a first lateral wiring layer of a layer stack of the semiconductor device;
the first portion of the conductive structure of the first test structure is electrically connected to the second portion of the conductive structure of the first test structure through a third portion located within a second lateral wiring layer of the layer stack arranged above the first lateral wiring layer;
the first portion of the conductive structure of the first test structure is electrically connected to a gate of a test transistor structure, a doping region of the test transistor structure or an electrode of a test capacitor;
the first portion of the conductive structure of the first test structure is electrically connected to a first test pad of the first test structure;
a sum of a lateral area occupied by the first portion of the conductive structure of the first test structure and a lateral area occupied by the second portion of the conductive structure of the first test structure is at least larger than 10 times a lateral area occupied by the gate of the test transistor structure or the electrode of the test capacitor;
each test structure of the plurality of test structures comprises an antenna effect test portion of the conductive structure of the respective test structure; and
the antenna effect test portions of the conductive structures of the test structures of the plurality of test structures occupy different lateral areas each.

6. The semiconductor device according to claim 5, further comprising a reference test structure comprising a first portion of a conductive structure and a second portion of the conductive structure located within the first lateral wiring layer, wherein:
the first portion of the conductive structure of the reference test structure is electrically connected to the second portion of the conductive structure of the reference test structure through a third portion located within the second lateral wiring layer or a third lateral wiring layer of the layer stack arranged above the first lateral wiring layer;
the first portion of the conductive structure of the reference test structure is electrically connected to a gate of a reference transistor structure, a doping region of the reference transistor structure or an electrode of a reference capacitor, wherein the first portion of the conductive structure of the reference test structure is electrically connected to a first test pad of the reference test structure; and
a sum of a lateral area occupied by the first portion of the conductive structure of the reference test structure and a lateral area occupied by the second portion of the conductive structure of the reference test structure is at least larger than 10 times a lateral area occupied by the gate of the test transistor structure or the electrode of the test capacitor.

7. The semiconductor device according to claim 6, wherein the first portion of the conductive structure of the reference test structure is electrically insulated from the second portion of the conductive structure of the reference test structure within the first lateral wiring layer.

8. The semiconductor device according to claim 6, wherein the sum of the lateral area occupied by the first portion of the conductive structure of the first test structure and the lateral area occupied by the second portion of the conductive structure of the first test structure differs by less than 20% from the sum of the lateral area occupied by the first portion of the conductive structure of the reference test structure and the lateral area occupied by the second portion of the conductive structure of the reference test structure.

9. The semiconductor device according to claim 5, wherein each test structure of the plurality of test structures is connected to an individual test pad.

10. The semiconductor device according to claim 5, wherein:
each test structure of the plurality of test structures comprises a first portion of the conductive structure and a second portion of the conductive structure located within the first lateral wiring layer;
the first portion of the conductive structure of each respective test structure is electrically connected to the second portion of the conductive structure of the respective test structure through a respective third portion located within the second lateral wiring layer or a third lateral wiring layer of the layer stack arranged above the first lateral wiring layer; and
the first portion of the conductive structure of each respective test structure is electrically connected to a gate of a respective test transistor structure, a doping region of the respective test transistor structure or an electrode of a respective capacitor.

11. The semiconductor device according to claim 5, wherein the second portion of the conductive structure of the first test structure is electrically insulated except for a connection to the third portion of the conductive structure of the first test structure.

12. The semiconductor device according to claim 5, wherein the first portion of the conductive structure of the first test structure is electrically insulated from the second portion of the conductive structure of the first test structure within the first lateral wiring layer.

13. The semiconductor device according to claim 5, wherein a source doping region of the test transistor structure is connected to a second test pad of the first test structure and a drain doping region of the test transistor structure is connected to a third test pad of the first test structure.

14. The semiconductor device according to claim 5, wherein the first lateral wiring layer is a lower most lateral metal wiring layer of the layer stack or a poly silicon layer of the layer stack.

15. The semiconductor device according to claim 14, wherein the gate of the test transistor structure is located within the poly silicon layer.

16. A semiconductor device comprising a plurality of test structures, wherein each test structure of the plurality of test structures comprises
 a conductive structure comprising a first portion and a second portion located within a first lateral wiring layer of a layer stack of the semiconductor device, and
 a test pad electrically connected to the conductive structure, wherein
  the first portion of the conductive structure is electrically connected to the second portion of the conductive structure through a third portion located within a second lateral wiring layer of the layer stack arranged above the first lateral wiring layer,
  the first portion of the conductive structure is electrically connected to an electronic device disposed within the semiconductor device,
  each test structure of the plurality of test structures comprises an antenna effect test portion of the conductive structure of the respective test structure, and
  the antenna effect test portions of the conductive structures of the test structures of the plurality of test structures occupy different lateral areas each.

17. The semiconductor device of claim 16, wherein a sum of a lateral area occupied by the first portion of the conductive structure and a lateral area occupied by the second portion of the conductive structure is at least larger than 10 times a lateral area of a feature occupied by the electronic device.

18. The semiconductor device of claim 17, wherein the electronic device comprises a transistor and the feature comprises a gate of the transistor or a doping region of the transistor.

19. The semiconductor device of claim 17, wherein the electronic device comprises a capacitor and the feature comprises an electrode of the capacitor.

* * * * *